US012792188B2

(12) United States Patent

Bok et al.

(10) Patent No.: US 12,792,188 B2

(45) Date of Patent: Nov. 10, 2026

(54) DISPLAY APPARATUS AND ELECTRONIC DEVICE INCLUDING THE SAME

(71) Applicant: Samsung Display Co., Ltd., Yongin-si (KR)

(72) Inventors: Seunglyong Bok, Yongin-si (KR); Sunghoon Kim, Yongin-si (KR); Anna Ryu, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 19/272,177

(22) Filed: Jul. 17, 2025

(65) Prior Publication Data

US 2026/0104776 A1 Apr. 16, 2026

(30) Foreign Application Priority Data

Oct. 10, 2024 (KR) ........................ 10-2024-0138022

(51) Int. Cl.
*G06F 3/044* (2006.01)
*H10K 59/40* (2023.01)

(52) U.S. Cl.
CPC .......... *G06F 3/0445* (2019.05); *G06F 3/0446* (2019.05); *H10K 59/40* (2023.02)

(58) Field of Classification Search
CPC ........ G06F 3/0445; G06F 3/044; G06F 3/047; G06F 3/041–0446; H10K 59/40; H10K 59/131; H10K 2102/3031
See application file for complete search history.

(56) References Cited

U.S. PATENT DOCUMENTS

| | | | | |
|---|---|---|---|---|
| 8,698,771 | B2 | 4/2014 | Lee et al. | |
| 9,582,124 | B2 | 2/2017 | Han | |
| 10,671,228 | B2 | 6/2020 | Lee | |
| 11,500,484 | B2 | 11/2022 | Bok et al. | |
| 11,647,154 | B2 | 5/2023 | Ahn et al. | |
| 2022/0107699 | A1* | 4/2022 | Jeong | G06F 3/0412 |
| 2022/0302420 | A1* | 9/2022 | Ma | G06F 3/0446 |
| 2023/0376150 | A1* | 11/2023 | Zheng | G06F 3/0425 |
| 2025/0017040 | A1* | 1/2025 | Kim | H10K 59/121 |

FOREIGN PATENT DOCUMENTS

| | | | |
|---|---|---|---|
| KR | 1020120104475 | A | 9/2012 |
| KR | 1020150012513 | A | 2/2015 |
| KR | 1020190098313 | A | 8/2019 |
| KR | 102380462 | B1 | 3/2022 |

* cited by examiner

*Primary Examiner* — Temesghen Ghebretinsae
*Assistant Examiner* — Ivelisse Martinez Quiles
(74) *Attorney, Agent, or Firm* — Innovation Counsel LLP

(57) ABSTRACT

A display apparatus includes a substrate including a pixel area and a transmissive area, a display element layer disposed on the substrate and including a light-emitting element disposed in the pixel area, an upper touch layer disposed on the display element layer and including upper touch electrodes at least partially surrounding the pixel area and the transmissive area, and a first conductive layer overlapping the transmissive area, and a lower touch layer disposed under the display element layer and including lower touch electrodes at least partially surrounding the pixel area and the transmissive area.

20 Claims, 29 Drawing Sheets

DISPLAY APPARATUS AND ELECTRONIC DEVICE INCLUDING THE SAME

CROSS-REFERENCE TO RELATED APPLICATION

This application is based on and claims priority under 35 U.S.C. § 119 to Korean Patent Application No. 10-2024-0138022, filed on Oct. 10, 2024, in the Korean Intellectual Property Office, the disclosure of which is incorporated by reference herein in its entirety.

BACKGROUND

1. Field

One or more embodiments relate to a display apparatus including a light-emitting diode. One or more embodiments relate to an electronic device including such display apparatus.

2. Description of the Related Art

An electronic device may include display apparatuses to visually display data. Display apparatuses may provide images by using light-emitting diodes. Display apparatuses are becoming more diverse in their uses and structures. Various attempts have been made to design transparent display apparatuses that provide images while allowing objects behind the display apparatuses to be seen.

SUMMARY

A display apparatus includes a pixel area where pixels for displaying an image are disposed and a transmissive area where pixels are not disposed. As a transmittance in the transmissive area increases, a transparency of the display apparatus may increase. The display apparatus may also include a touch layer for detecting a user's input.

One or more embodiments provide a double-sided touch function that enables a display apparatus to be touched and manipulated on both surfaces, for example, a top surface and a bottom surface (or a front surface and a rear surface), of the display apparatus. One or more embodiments combine a double-sided touch function with a transparent display apparatus.

Additional aspects will be set forth in part in the description which follows and, in part, will be apparent from the description, or may be learned by practice of the presented embodiments.

According to one or more embodiments, a display apparatus includes a substrate including a pixel area and a transmissive area, a display element layer disposed on the substrate and including a light-emitting element disposed in the pixel area, an upper touch layer disposed on the display element layer and including upper touch electrodes at least partially surrounding the pixel area and the transmissive area, and a first conductive layer overlapping the transmissive area, and a lower touch layer disposed under the display element layer and including lower touch electrodes at least partially surrounding the pixel area and the transmissive area.

In an embodiment, the first conductive layer may further overlap a pixel area disposed adjacent to the transmissive area which is overlapped by the first conductive layer.

In an embodiment, the upper touch electrodes may include a first upper touch electrode and a second upper touch electrode disposed on the first upper touch electrode, and the first conductive layer may be disposed on the second upper touch electrode.

In an embodiment, the first conductive layer and the second upper touch electrode may contact each other.

In an embodiment, the upper touch electrodes may include a first upper touch electrode including a plurality of lines and a second upper touch electrode disposed on the first upper touch electrode and including a plurality of lines, wherein one of the plurality of lines of the second upper touch electrode overlaps two or more of the plurality of lines of the first upper touch electrode.

In an embodiment, the lower touch layer may further include a second conductive layer disposed between the lower touch electrodes and the display element layer, wherein the second conductive layer overlaps the pixel area.

In an embodiment, the second conductive layer may overlap the pixel area and the transmissive area.

In an embodiment, some of the lower touch electrodes may overlap the light-emitting element and include an opening.

In an embodiment, at least some of the lower touch electrodes may be integrally formed over the pixel area and transmissive area on the substrate.

In an embodiment, when viewed in a thickness direction of the substrate, widths of at least some of the lower touch electrodes may be greater than widths of at least some of the upper touch electrodes.

According to one or more embodiments, a display apparatus includes a substrate including a pixel area and a transmissive area, a display element layer disposed on the substrate and including a light-emitting element disposed in the pixel area, an upper touch layer disposed on the display element layer and including upper touch electrodes at least partially surrounding the pixel area and the transmissive area, and a lower touch layer disposed under the display element layer and including lower touch electrodes at least partially surrounding the pixel area and the transmissive area, wherein widths of at least some of the lower touch electrodes are greater than widths of at least some of the upper touch electrodes.

In an embodiment, the upper touch electrodes may include an upper opening disposed in an area corresponding to the light-emitting element of the pixel area, and the lower touch electrodes may include a lower opening disposed in an area corresponding to the light-emitting element of the pixel area, wherein a size of the upper opening is greater than a size of the lower opening.

In an embodiment, the display element layer may include a plurality of light-emitting elements, wherein the lower opening disposed in an area corresponding to two or more of the light-emitting elements.

In an embodiment, a width of a portion of the lower touch electrodes extending in a first direction may be different from a width of a portion of the lower touch electrodes extending in a second direction different from the first direction.

In an embodiment, some of the lower touch electrodes may overlap the light-emitting element and may include an opening.

In an embodiment, the upper touch layer may further include a first conductive layer disposed on the upper touch electrodes and overlapping the transmissive area.

In an embodiment, the first conductive layer of the upper touch layer may directly contact some of the upper touch electrodes.

In an embodiment, the lower touch layer may further include a second conductive layer disposed between the lower touch electrodes and the display element layer and overlapping the pixel area.

In an embodiment, the second conductive layer of the lower touch layer may overlap the pixel area and the transmissive area.

In an embodiment, the lower touch electrodes may include a first lower touch electrode and a second lower touch electrode disposed on the first lower touch electrode, wherein the first lower touch electrode is integrally formed over the pixel area and transmissive area on the substrate.

According to one or more embodiments, an electroinic device includes a display apparatus, wherein the display apparatus includes a substrate including a pixel area and a transmissive area, a display element layer disposed on the substrate and including a light-emitting element disposed in the pixel area, an upper touch layer disposed on the display element layer and including upper touch electrodes at least partially surrounding the pixel area and the transmissive area, and a first conductive layer overlapping the transmissive area, and a lower touch layer disposed under the display element layer and including lower touch electrodes at least partially surrounding the pixel area and the transmissive area.

BRIEF DESCRIPTION OF THE DRAWINGS

The above and other aspects, features, and advantages of certain embodiments will be more apparent from the following description taken in conjunction with the accompanying drawings, in which.

DETAILED DESCRIPTION

Figure 1:
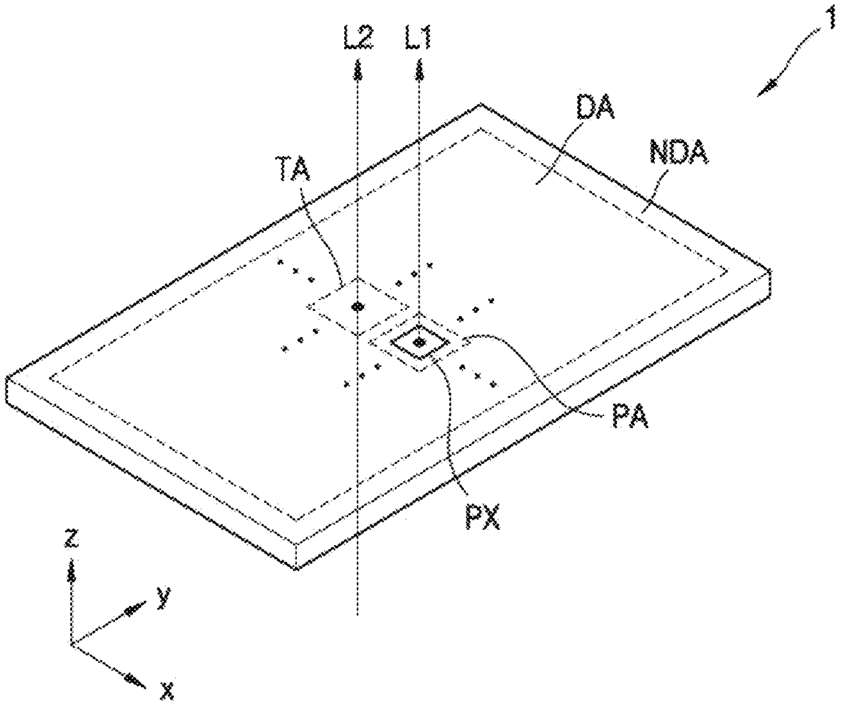
FIG. 1 is a schematic perspective view illustrating a display apparatus according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the disclosure allows for various changes and numerous embodiments, certain embodiments will be illustrated in the drawings and described in the detailed description. Effects and features of the disclosure, and methods for achieving them will be clarified with reference to embodiments described below in detail with reference to the drawings. However, the disclosure is not limited to the following embodiments and may be embodied in various forms.

Hereinafter, embodiments will be described in detail with reference to the accompanying drawings, wherein the same or corresponding elements are denoted by the same reference numerals throughout and a repeated description thereof is omitted.

Although the terms "first," "second," etc. may be used to describe various elements, these elements should not be limited by these terms. These terms are only used to distinguish one element from another.

As used herein, the singular forms "a," "an," and "the" are intended to include the plural forms as well, unless the context clearly indicates otherwise.

It will be understood that the terms "including" and "having" are intended to indicate the existence of the features or elements described in the specification, and are not intended to preclude the possibility that one or more other features or elements may exist or may be added.

It will be further understood that, when a layer, region, or component is referred to as being "on" another layer, region, or component, it may be directly on the other layer, region, or component, or may be indirectly on the other layer, region, or component with intervening layers, regions, or components therebetween.

Sizes of components in the drawings may be exaggerated or reduced for convenience of explanation. For example, because sizes and thicknesses of components in the drawings are arbitrarily illustrated for convenience of explanation, the disclosure is not limited thereto.

When a certain embodiment may be implemented differently, a specific process order may be different from the described order. For example, two consecutively described processes may be performed substantially at the same time or may be performed in an order opposite to the described order.

"A and/or B" is used herein to select only A, select only B, or select both A and B. "At least one of A or B" is used to select only A, select only B, or select both A and B.

It will be understood that when a layer, a region, or a component is referred to as being "connected" to another layer, region, or component, it may be "directly connected" to the other layer, region, or component and/or may be "indirectly connected" to the other layer, region, or component with other layers, regions, or components interposed therebetween. For example, when a layer, a region, or a component is referred to as being "electrically connected," it may be directly electrically connected, and/or may be indirectly electrically connected with intervening layers, regions, or components therebetween.

The x-axis, the y-axis and the z-axis are not limited to three axes of the rectangular coordinate system and may be interpreted in a broader sense. For example, the x-axis, the y-axis, and the z-axis may be perpendicular to one another or may represent different directions that are not perpendicular to one another.

FIG. 1 is a schematic perspective view illustrating a display apparatus according to an embodiment.

Referring to FIG. 1, a display apparatus 1 may include a display area DA, and a non-display area NDA disposed outside the display area DA. The display apparatus 1 may display an image through sub-pixels PX disposed in the display area DA. The non-display area NDA, which is disposed outside the display area DA and does not display an image, may entirely surround the display area DA. A driver or the like for applying an electrical signal or power to the display area DA may be disposed in the non-display area NDA. A pad to which an electronic device or a printed circuit board may be electrically connected may be disposed in the non-display area NDA.

Although the display area DA has a polygonal shape (e.g., a quadrangular shape) in which a length in a ±x direction is shorter than a length in a ±y direction in FIG. 1, in another embodiment, the display area DA may have a polygonal shape (e.g., a quadrangular shape) in which a length in the ±y direction is shorter than a length in the ±x direction. Although the display area DA has a substantially quadrangular shape in FIG. 1, the disclosure is not limited thereto. In another embodiment, the display area DA may have any of various shapes such as a polygon with n sides (an N-gon shape), where N is a natural number of 3 or more, a circular shape, or an elliptical shape. Although the display area DA has a shape with corners where straight lines meet each other in FIG. 1, in another embodiment, the display area DA may have rounded corners.

The display area DA may include a pixel area PA and a transmissive area TA.

The sub-pixel PX may be disposed in the pixel area PA. In an embodiment, a plurality of pixel areas PA and a plurality of sub-pixels PX may be provided. Each sub-pixel PX may provide a certain image through light L1 emitted from a corresponding light-emitting element. In an embodiment, one sub-pixel PX may be disposed in one pixel area PA. In an embodiment, a plurality of sub-pixels PX may be disposed in one sub-pixel area PA.

The transmissive area TA may be disposed adjacent to the pixel area PA and may transmit light. In the transmissive area TA, light L2 incident on one surface of the display apparatus 1 may pass through the display apparatus 1 and may travel to the opposite side. For example, in the transmissive area TA, light L2 incident on a −z direction surface of the display apparatus 1 in a +z direction may pass through the display apparatus 1 and may exit to a +z direction surface of the display apparatus 1. In an embodiment, a plurality of transmissive areas TA may be provided.

Accordingly, the display apparatus 1 may provide an image through the light L1 emitted from the sub-pixel PX and at the same time, may display an image in a −z direction by transmitting the light L2 incident on the transmissive area TA. In other words, the display apparatus 1 may be a transparent display apparatus capable of displaying both an image provided by the display apparatus 1 and an image behind the display apparatus 1.

In an embodiment, one surface of the display apparatus 1 facing the +z direction may be a front surface of the display apparatus 1, and one surface of the display apparatus 1 facing the −z direction may be a rear surface of the display apparatus 1. In this case, the light L2 incident on the transmissive area TA may be light traveling from behind the display apparatus 1 to in front of the display apparatus 1.

In an embodiment, one surface of the display apparatus 1 facing the +z direction may be a front surface of the display apparatus 1 and one surface of the display apparatus 1 facing the −z direction may be a rear surface of the display apparatus 1. In this case, the light L2 incident on the transmissive area TA may be light traveling from the back side of the display apparatus 1 to the front side of the display apparatus 1.

As such, the terms referring to a surface of the display apparatus 1 facing the +z direction and a surface of the display apparatus 1 facing the −z direction may vary according to an orientation of the display apparatus 1. In the specification, for convenience of explanation, a surface facing the +z direction is referred to as a front surface and a surface facing the −z direction is referred to as a rear surface.

Figure 2:
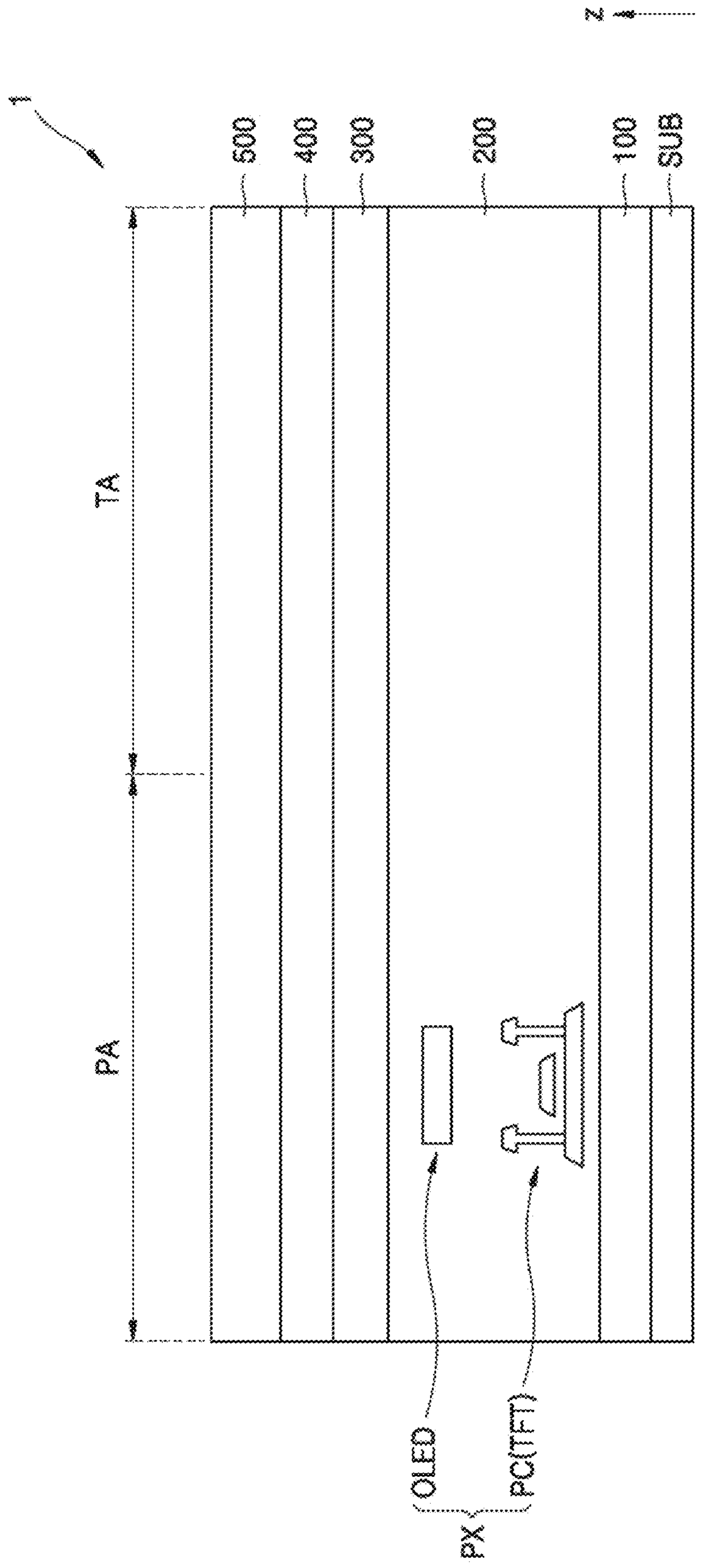
FIG. 2 is a schematic cross-sectional view illustrating a display apparatus according to an embodiment.

FIG. 2 is a schematic cross-sectional view illustrating a display apparatus, according to an embodiment.

Referring to FIG. 2, the display apparatus 1 may include a substrate SUB, a lower touch layer 100, a display element layer 200, an encapsulation layer 300, an upper touch layer 400, and an optical functional layer 500.

The substrate SUB may include a glass material or a plastic polymer resin. In an embodiment, the substrate SUB may have a structure in which a base layer including a polymer resin and a barrier layer including an inorganic insulating material are stacked. The polymer resin may include polyethersulfone (PES), polyetherimide (PEI), polyethylene naphthalate (PEN), polyethylene terephthalate (PET), polyphenylene sulfide (PPS), polyarylate (PAR), polyimide (PI), and polycarbonate (PC). When the substrate SUB is formed of a plastic material or a metal material, the flexibility of the substrate SUB may be greater than when the substrate SUB is formed of a glass material.

The lower touch layer 100 may be disposed on the substrate SUB. In an embodiment, the lower touch layer may include one or more electrodes, one or more insulating layers disposed between the electrodes, and an additional conductive layer.

The display element layer 200 may be disposed on the lower touch layer 100. In an embodiment, the display element layer 200 may include the sub-pixel PX described above. The sub-pixel PX may include an organic light-emitting diode OLED as a light-emitting element. Also, the sub-pixel PX may include a sub-pixel circuit PC connected to the organic light-emitting diode OLED. A thin-film transistor TFT that is a part of the sub-pixel circuit PC is exemplarily illustrated in FIG. 2. The organic light-emitting diode OLED may be disposed in the pixel area PA. Although the sub-pixel circuit PC is disposed in the pixel area PA in FIG. 2, the disclosure is not limited thereto. A part of the sub-pixel circuit PC may extend to the transmissive area TA and/or the non-display area NDA (see FIG. 1).

Although the light-emitting element of the sub-pixel PX of the display apparatus 1 is the organic light-emitting diode OLED in the specification, the disclosure is not limited thereto. In another embodiment, the display apparatus 1 may be a light-emitting display apparatus including an inorganic light-emitting diode, that is, an inorganic light-emitting display apparatus. In another embodiment, the display apparatus 1 may be a quantum dot light-emitting display apparatus.

Figure 3:
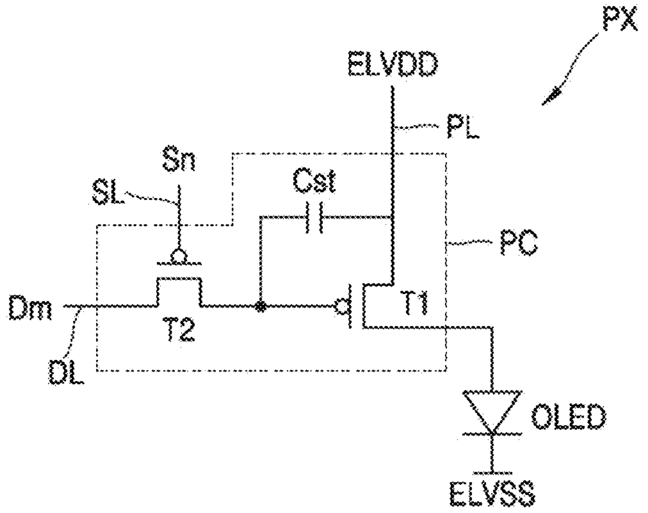
FIG. 3 is an equivalent circuit diagram illustrating a sub-pixel according to an embodiment.

FIG. 3 is an equivalent circuit diagram illustrating a sub-pixel according to an embodiment.

The sub-pixel circuit PC may be electrically connected to a light-emitting element OLED. In an embodiment, the sub-pixel PX may include the organic light-emitting diode OLED as a light-emitting element.

The sub-pixel circuit PC may include a first transistor T1, a second transistor T2, and a storage capacitor Cst.

The second transistor T2 that is a switching transistor may be connected to a scan line SL and a data line DL, and may be turned on by a switching signal input from the scan line SL to transmit a data signal Dm input from the data line DL to the first transistor T1. The storage capacitor Cst may have one end electrically connected to the second transistor T2 and the other end electrically connected to a driving voltage line PL, and may store a voltage corresponding to a difference between a voltage received from the second transistor T2 and a first power supply voltage ELVDD supplied from the driving voltage line PL.

The first transistor T1 that is a driving transistor may be connected between the driving voltage line PL and the organic light-emitting diode OLED, and may control a magnitude of driving current flowing from the driving voltage line PL to the organic light-emitting diode OLED in response to a value of the voltage stored in the storage capacitor Cst. The organic light-emitting diode OLED may emit light having a certain luminance according to the driving current. A counter electrode of the organic light-emitting diode OLED may receive a second power supply voltage ELVSS.

Although the sub-pixel circuit PC includes two transistors and one storage capacitor in FIG. 3, the disclosure is not limited thereto. For example, the number of transistors or the number of storage capacitors may be changed in various ways according to a design of the sub-pixel circuit PC.

Hereinafter, embodiments of the upper touch layer 400 will be described with reference to FIGS. 4 to 10.

Figure 4:
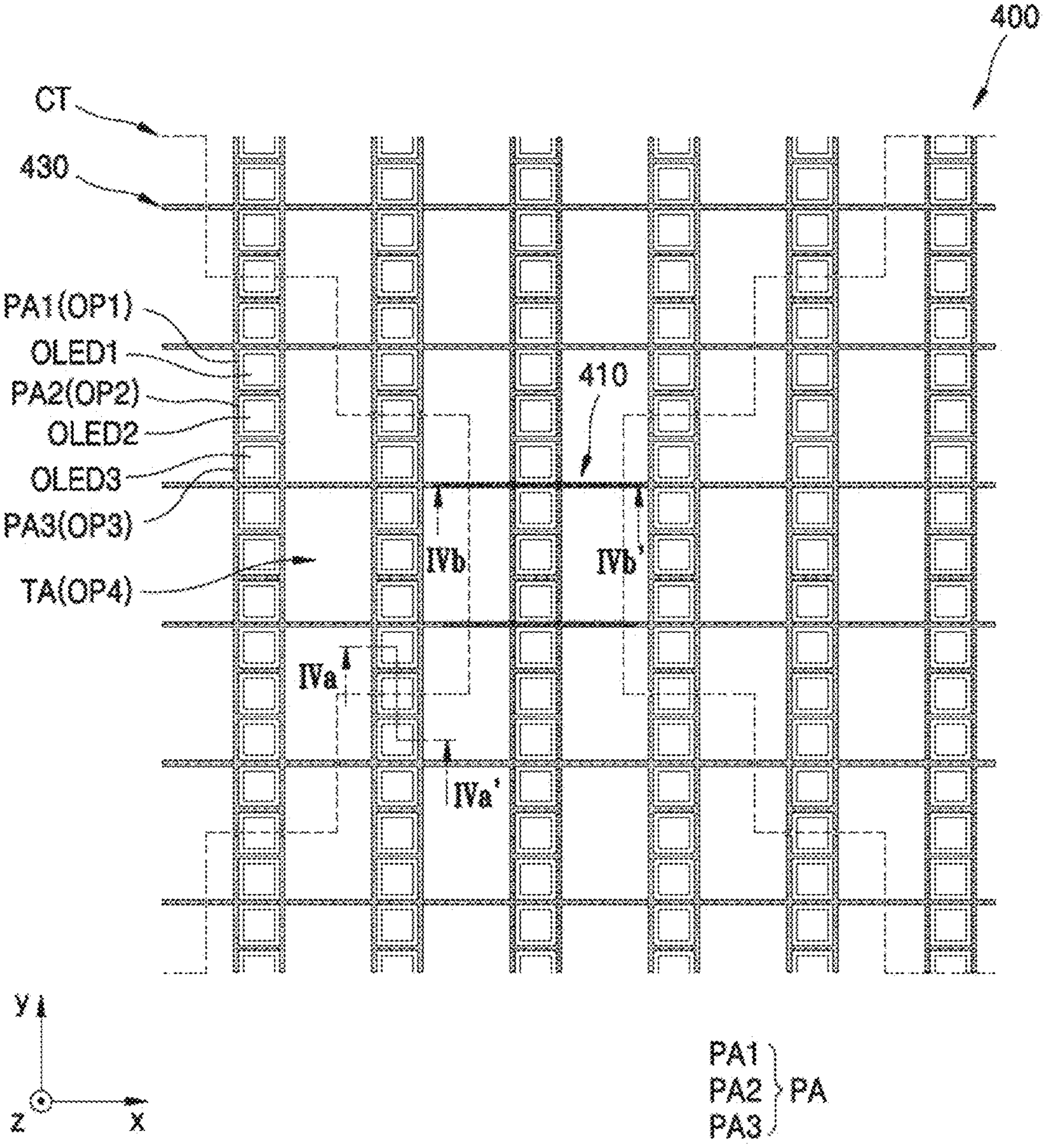
FIG. 4 is a plan view illustrating a display apparatus according to an embodiment.
Figure 5A:
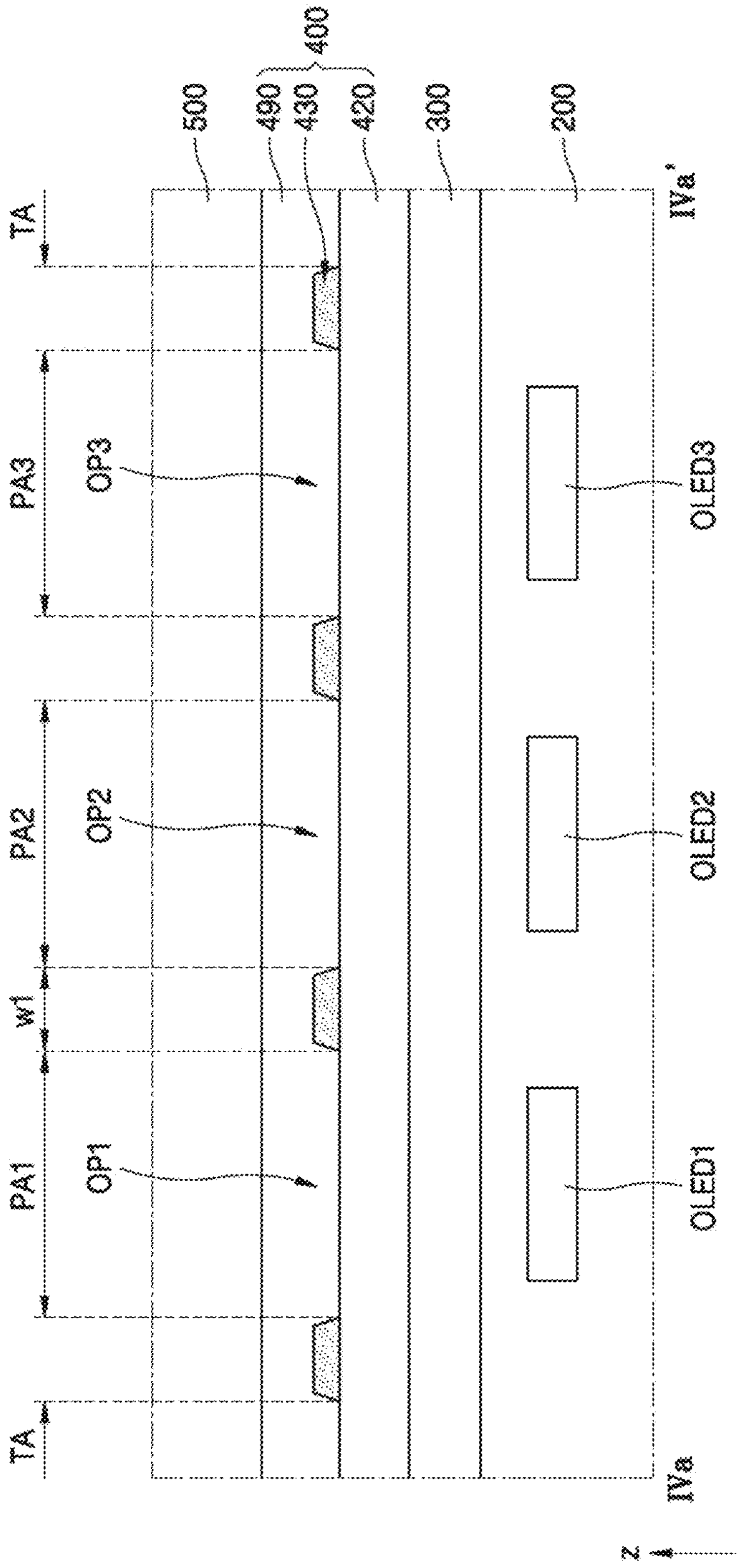
FIG. 5A is a cross-sectional view illustrating a display apparatus according to an embodiment.
Figure 5B:
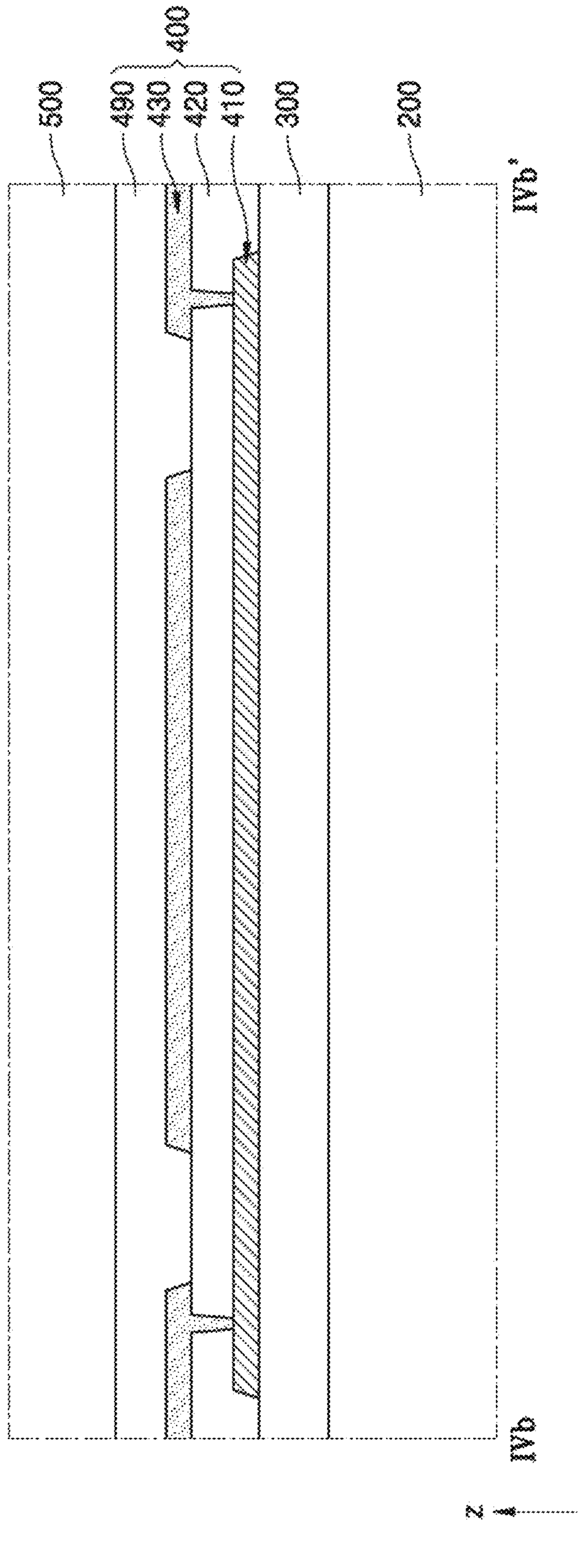
FIG. 5B is a cross-sectional view illustrating a display apparatus according to an embodiment.

FIG. 4 is a plan view illustrating a display apparatus according to an embodiment. FIG. 5A is a cross-sectional view illustrating a display apparatus according to an embodiment. FIG. 5B is a cross-sectional view illustrating a display apparatus according to an embodiment.

FIG. 4 illustrates a part of the upper touch layer 400 for convenience of illustration and explanation. FIG. 4 may illustrate, for example, a mutual capacitance type touch layer. FIG. 5A is a cross-sectional view taken along line IVa-IVa' of FIG. 4. FIG. 5B is a cross-sectional view taken along line IVb-IVb' of FIG. 4.

Referring to FIGS. 4, 5A, and 5B, the upper touch layer 400 may include a first upper touch electrode 410, a first upper touch insulating layer 420, a second upper touch electrode 430, and a second upper touch insulating layer 490.

The first upper touch electrode 410 may be disposed on the encapsulation layer 300. In an embodiment, an additional insulating layer may be disposed between the first upper touch electrode 410 and the encapsulation layer 300. The first upper touch electrode 410 may extend in the ±x direction. A part of the first upper touch electrode 410 may extend between adjacent pixel areas PA. A part of the first upper touch electrode 410 may extend between adjacent transmissive areas TA. However, a shape of the first upper touch electrode 410 is not limited to that illustrated in FIG. 4. In another embodiment, the first upper touch electrode 410 may extend in the ±y direction.

The first upper touch insulating layer 420 may be disposed on the first upper touch electrode 410. The first upper touch insulating layer 420 may cover the first upper touch electrode 410. In an embodiment, the first upper touch insulating layer 420 may be a planarization layer. A contact hole overlapping the first upper touch electrode 410 may be defined in a part of the first upper touch insulating layer 420.

The second upper touch electrode 430 may be disposed on the first upper touch insulating layer 420. The second upper touch electrode 430 may have a substantially mesh shape. For example, some mesh lines of the second upper touch electrode 430 may extend in the +x direction, and other mesh lines may extend in the ±y direction to entirely define a plurality of openings.

The second upper touch electrode 430 may at least partially surround (e.g., entirely) surround a plurality of pixel areas PA and a plurality of transmissive areas TA. Alternatively, a plurality of pixel areas PA and a plurality of transmissive areas TA may be partitioned or defined by mesh lines of the second upper touch electrode 430. For example, a first pixel area PA1, a second pixel area PA2, and a third pixel area PA3 may be defined by the mesh lines of the second upper touch electrode 430.

In other words, a plurality of openings may be defined in the second upper touch electrode 430 and the openings may be disposed in areas correspond to a plurality of pixel areas PA and a plurality of transmissive areas TA. For example, a first opening OP1, a second opening OP2, a third opening OP3, and a fourth opening OP4 may be defined in the second upper touch electrode 430. The first opening OP1 may be disposed in an area corresponding to the first pixel area PA1. The second opening OP2 may be disposed in an area corresponding to the second pixel area PA2. The third opening OP3 may be disposed in an area corresponding to the third pixel area PA3. The fourth opening OP4 may be disposed in an area corresponding to the transmissive area TA.

A plurality of light-emitting elements disposed in the display element layer 200 may be disposed in areas corresponding to the plurality of openings of the second upper touch electrode 430 or the plurality of pixel areas PA. For example, a first organic light-emitting diode OLED1 may be disposed in an area corresponding to the first pixel area PA1 (or the first opening OP1). Likewise, a second organic light-emitting diode OLED2 may be disposed in an area corresponding to the second pixel area PA2 (or the second opening OP2). Likewise, a third organic light-emitting diode OLED3 may be disposed in an area corresponding to the third pixel area PA3 (or the third opening OP3).

In an embodiment, the upper touch layer 400 may be a mutual capacitance type touch layer. In this case, the first upper touch electrode 410 may be a bridge electrode, and the second upper touch electrode 430 may be a sensor electrode. In an embodiment, as shown in FIG. 4, the second upper touch electrode 430 may be cut along a virtual cutting line CT marked by a dashed line. Accordingly, a part of the second upper touch electrode 430 may generally extend integrally along the ±y direction. Another part of the second upper touch electrode 430 may be disposed in spaces in which the part of the second upper touch electrodes 430 are not disposed to be disposed along the ±x direction and may be disconnected in some areas. For example, the second upper touch electrode 430 may be disconnected in areas crossing to the first upper touch electrode 410.

As shown in FIG. 5B, the first upper touch electrode 410 and the second upper touch electrode 430 may directly contact and are (electrically) connected to each other through a contact hole formed in the first upper touch insulating layer 420. Accordingly, disconnected portions of the second upper touch electrode 430 may be (electrically) connected through the first upper touch electrode 410.

Although the first upper touch electrode 410 extends in the ±x direction to connect the disconnected portions of the second upper touch electrode 430 in FIG. 4, the disclosure is not limited thereto. In another embodiment, a part of the second upper touch electrode 430 may generally extend integrally along the ±x direction, and another part of the second upper touch electrode 430 may be disposed in spaces in which the part of the second upper touch electrodes 430 are not disposed to be disposed along the ±y direction and may be disconnected in some areas. In this case, the first upper touch electrode 410 may extend in the ±y direction to connect disconnected portions of the second upper touch electrode 430.

The second upper touch insulating layer 490 may be disposed on the second upper touch electrode 430. The second upper touch insulating layer 490 may entirely cover the second upper touch electrode 430. The second upper touch insulating layer 490 may fill the openings defined in the second upper touch electrode 430 and may directly contact the first upper touch insulating layer 420. For example, the second upper touch insulating layer 490 may fill the first opening OP1, the second opening OP2, the third opening OP3, and the fourth opening OP4 and may directly contact the first upper touch insulating layer 420. In other words, the second upper touch insulating layer 490 may directly contact the first upper touch insulating layer 420 in a plurality of pixel areas PA (e.g., the first pixel area PA1, the second pixel area PA2, and the third pixel area PA3) or a plurality of transmissive areas TA. In an embodiment, the second upper touch insulating layer 490 may be a planarization layer.

In an embodiment, a plurality of sub-pixels may constitute one pixel. For example, a first sub-pixel including the first organic light-emitting diode OLED1, a second sub-pixel including the second organic light-emitting diode OLED2, and a third sub-pixel including the third organic light-emitting diode OLED3 may constitute one pixel. FIG. 4 illustrates an example where the first sub-pixel, the second sub-pixel, and the third sub-pixel are arranged along the ±y direction. Also, FIG. 4 illustrates an example where a plurality of pixels are arranged along the ±y direction and arranged along the ±x direction with a transmissive area TA disposed between adjacent pixels. However, this arrangement is only an example, and the disclosure is not limited thereto.

In an embodiment, the first to third organic light-emitting diodes OLED1, OLED2, and OLED3 may emit light of different wavelength bands (i.e., colors). In an embodiment, the first organic light-emitting diode OLED1 may emit red light, the second organic light-emitting diode OLED2 may emit green light, and the third organic light-emitting diode OLED3 may emit blue light.

In an embodiment, the first to third organic light-emitting diodes OLED1, OLED2, and OLED3 may emit light of the same wavelength band (i.e., color). In an embodiment, the first to third organic light-emitting diodes OLED1, OLED2, and OLED3 may emit white light. In an embodiment, the first to third organic light-emitting diodes OLED1, OLED2, and OLED3 may emit blue light.

In an embodiment, each of the first upper touch electrode 410 and the second upper touch electrode 430 may include a conductive material. For example, each of the first upper touch electrode 410 and the second upper touch electrode 430 may include a metal.

Figure 6:
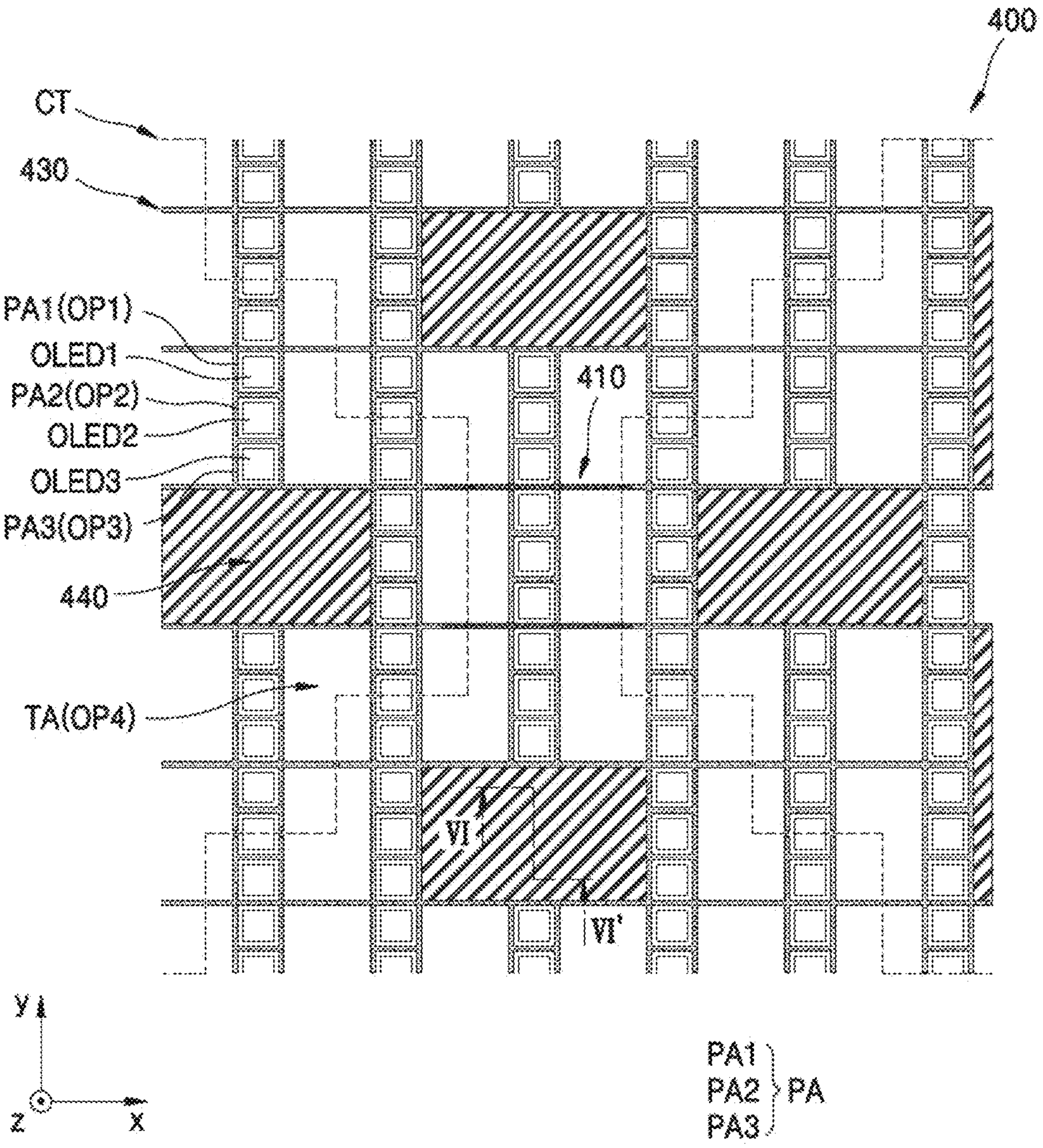
FIG. 6 is a plan view illustrating a display apparatus according to an embodiment.
Figure 7:
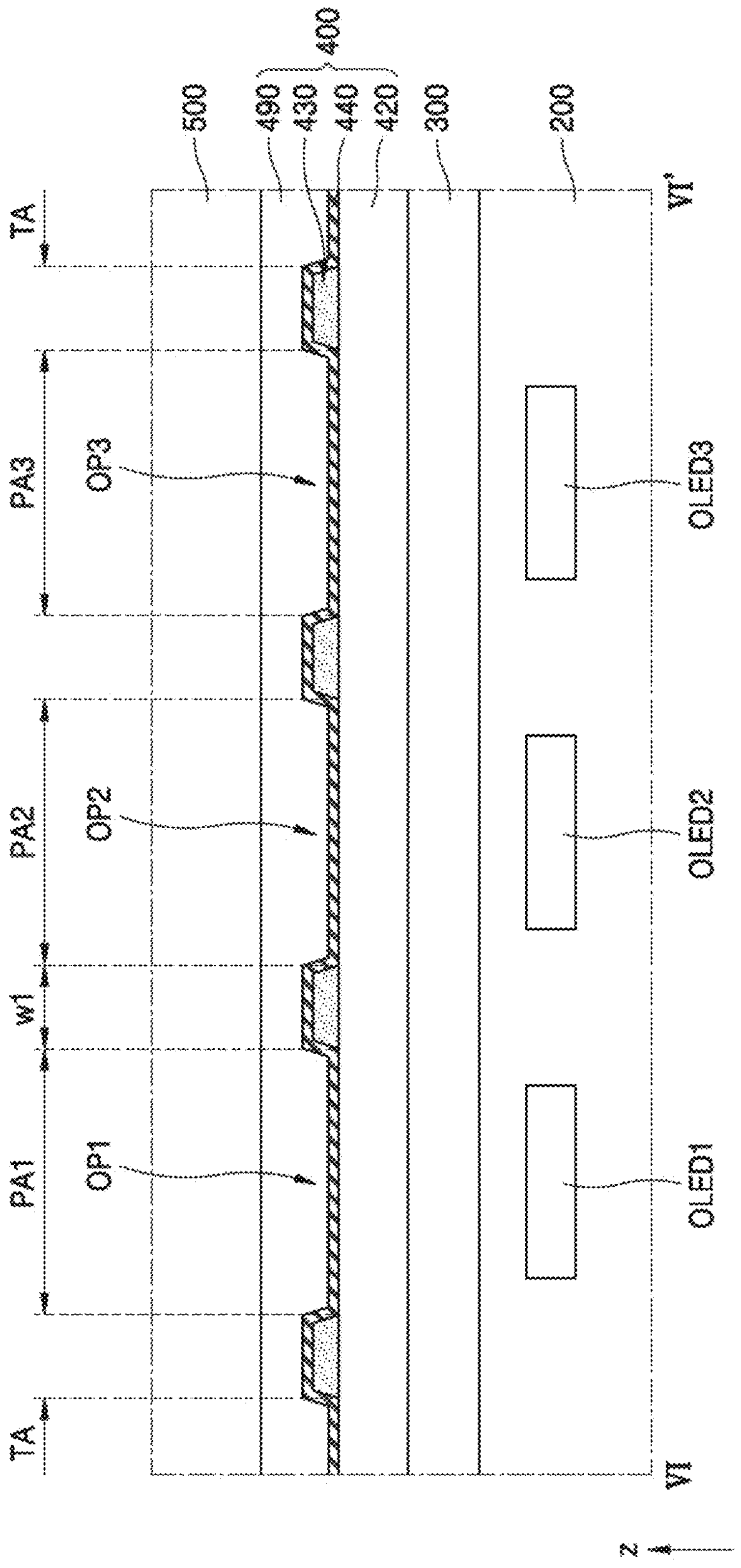
FIG. 7 is a cross-sectional view illustrating a display apparatus according to an embodiment.

FIG. 6 is a plan view illustrating a display apparatus according to an embodiment. FIG. 7 is a cross-sectional view illustrating a display apparatus according to an embodiment.

FIG. 6 illustrates a part of the upper touch layer 400 for convenience of illustration and explanation. FIG. 6 may illustrate, for example, a mutual capacitance type touch layer. FIG. 7 is a cross-sectional view taken along line VI-VI' of FIG. 6.

In FIGS. 6 and 7, the same features as those described with reference to FIGS. 4, 5A, and 5B will not be repeatedly described.

Referring to FIGS. 6 and 7, the upper touch layer 400 may include a first conductive layer 440. The first conductive layer 440 may overlap a plurality of pixel areas PA. The first conductive layer 440 may overlap a plurality of transmissive areas TA. The first conductive layer 440 may include a plurality of conductive islands that are spaced apart from each other, and each conductive island may overlap a plurality of pixel areas PA and a plurality of transmissive areas TA. In another embodiment, each conductive island may overlap a plurality of pixel areas PA and one transmissive area TA. FIG. 6 illustrates an example where one island overlaps three pixel areas PA and two transmissive areas TA disposed on both sides of the three pixel areas PA along the first direction x.

The first conductive layer 440 may be disposed between the second upper touch electrode 430 and the second upper touch insulating layer 490. The first conductive layer 440 may contact the second upper touch electrode 430. The first conductive layer 440 may electrically connect some portions of the second upper touch electrode 430 separated in the pixel area PA or the transmissive area TA. Accordingly, as the first conductive layer 440 is disposed, resistance in the second upper touch electrode 430 may be generally reduced.

In order to ensure a light-transmitting property in the transmissive area TA, the first conductive layer 440 may include a transparent material. The first conductive layer 440 may include a conductive material. In an embodiment, the first conductive layer 440 may include a transparent conductive oxide (TCO). For example, the first conductive layer 440 may include ITO, $In_2O_3$, or IZO.

Figure 8:
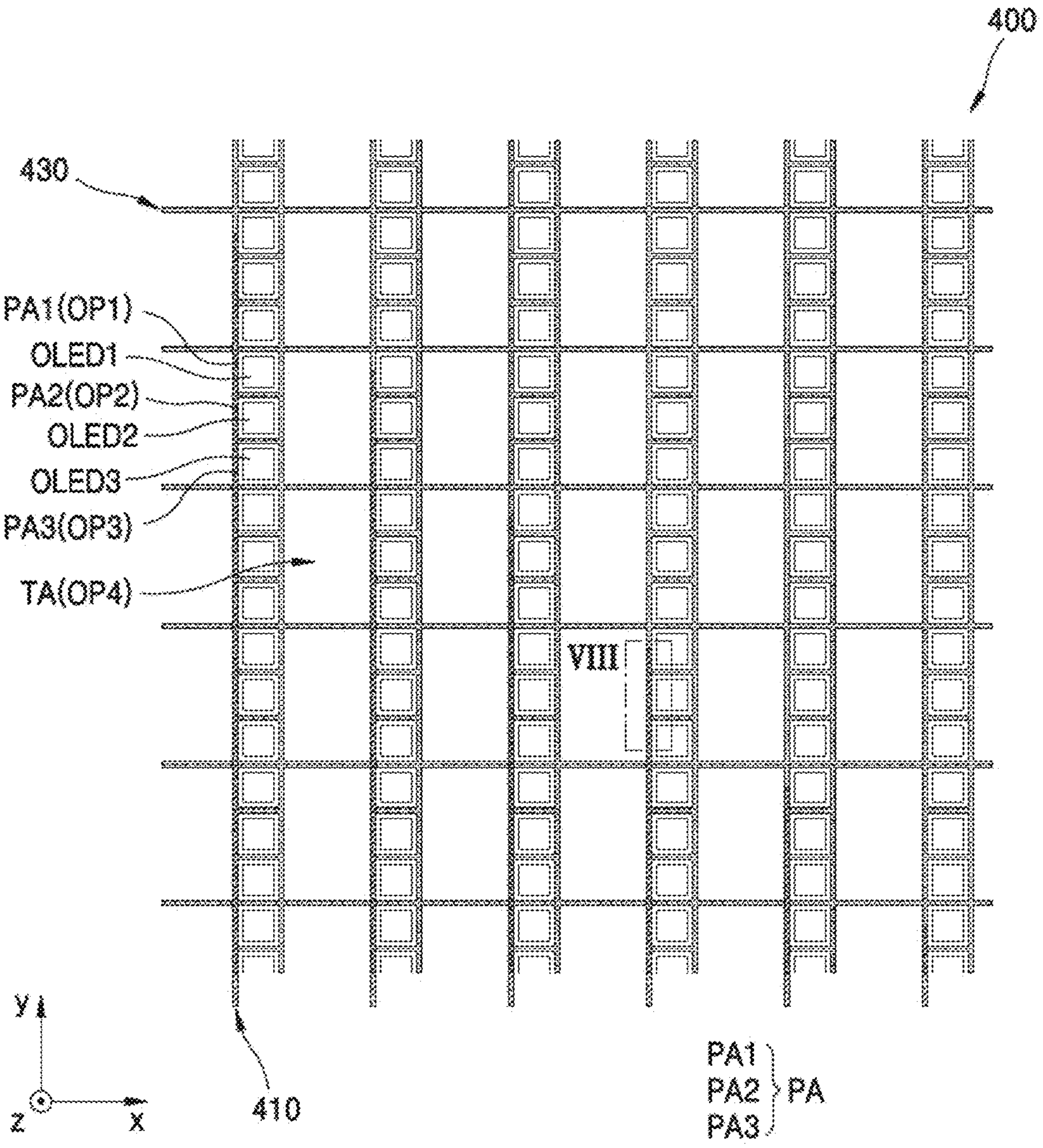
FIG. 8 is a plan view illustrating a display apparatus according to an embodiment.
Figure 9:
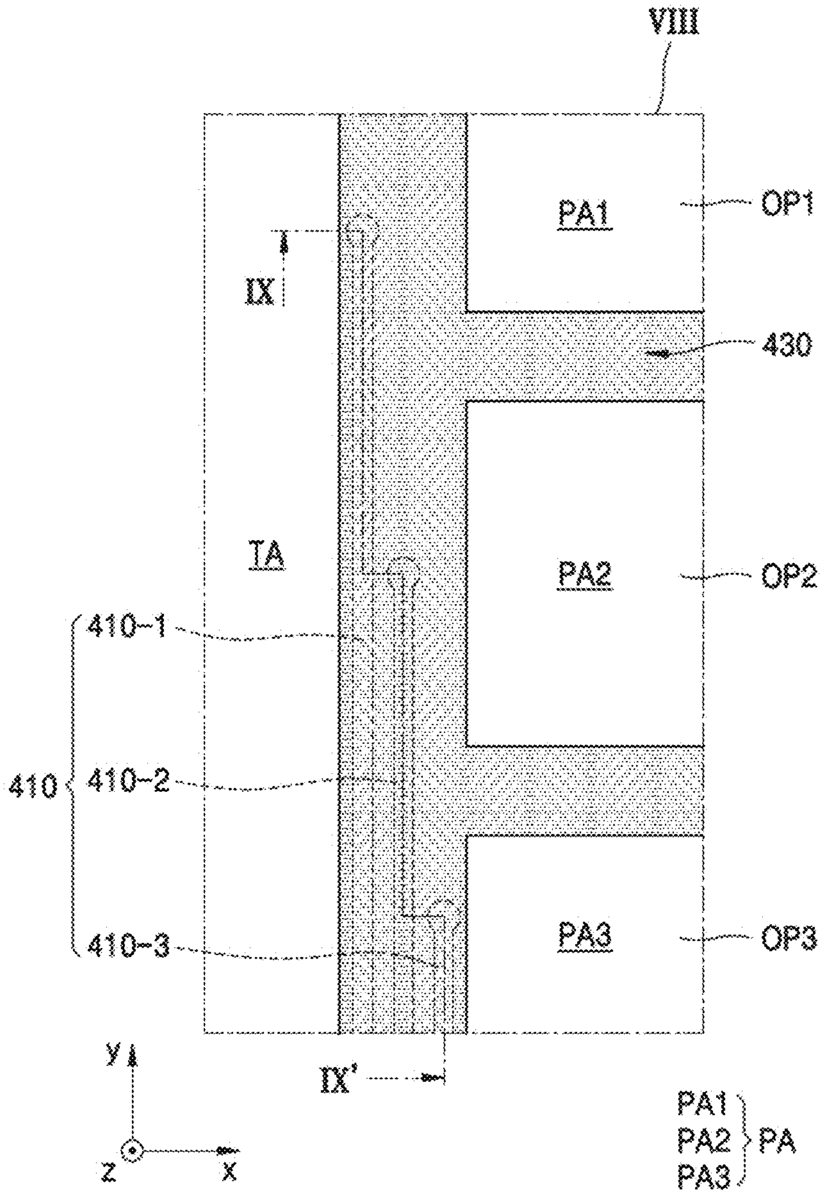
FIG. 9 is an enlarged plan view illustrating a display apparatus according to an embodiment.
Figure 10:
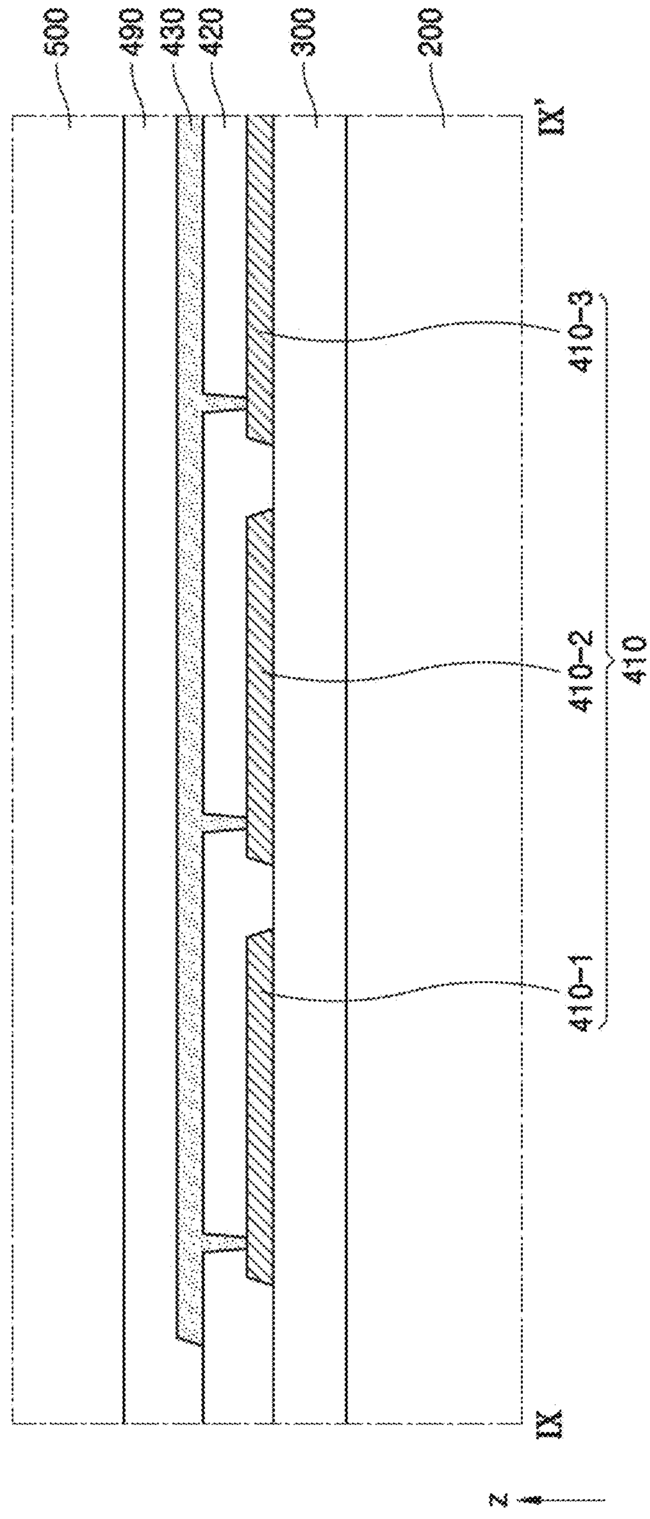
FIG. 10 is a cross-sectional view illustrating a display apparatus according to an embodiment.

FIG. 8 is a plan view illustrating a display apparatus according to an embodiment. FIG. 9 is an enlarged plan view illustrating a display apparatus according to an embodiment. FIG. 10 is a cross-sectional view illustrating a display apparatus according to an embodiment.

FIG. 8 illustrates a part of the upper touch layer 400 for convenience of illustration and explanation. FIG. 8 may illustrate, for example, a self-capacitance type touch layer. FIG. 9 is an enlarged plan view illustrating a portion VIII of FIG. 8. FIG. 10 is a cross-sectional view taken along line IX-IX' of FIG. 9.

In FIGS. 8 to 10, the same features as those described with reference to FIGS. 4, 5A, and 5B will not be repeatedly described.

In an embodiment, the upper touch layer 400 may be a self-capacitance type touch layer. In this case, the first upper touch electrode 410 may be a tracer electrode, and the second upper touch electrode 430 may be a sensor electrode.

Referring to FIG. 8, the first upper touch electrode 410 may include a plurality of lines extending along one direction (e.g., the ±y direction). The plurality of lines of the first upper touch electrode 410 may overlap the second upper touch electrode 430. The plurality of lines of the first upper touch electrode 410 may contact the second upper touch electrode 430 in an area overlapping the second upper touch electrode 430. The plurality of lines of the first upper touch electrode 410 may have different lengths (e.g., lengths in the ±y direction). The plurality of lines of the first upper touch electrode 410 may respectively contact the second upper touch electrodes 430 at different points.

Although the plurality of lines of the first upper touch electrode 410 extend in the ±y direction in FIG. 8, the disclosure is not limited thereto. In an embodiment, the plurality of lines of the first upper touch electrode 410 may extend in the ±x direction.

Although one of the plurality of lines of the first upper touch electrode 410 overlaps a portion (or a mesh line) of the second upper touch electrode 430 extending in the ±y direction in FIG. 8, the disclosure is not limited thereto. Two or more of the plurality of lines of the first upper touch electrode 410 may overlap a portion (or a mesh line) of the second upper touch electrode 430 extending in the ±y direction, and this embodiment will be described in detail with reference to FIGS. 9 and 10.

Referring to FIGS. 9 and 10, a width of each of the plurality of lines of the first upper touch electrode 410 may be less than a width of a mesh line of the second upper touch electrode 430. Accordingly, two or more of the plurality of lines of the first upper touch electrode 410 may overlap one mesh line of the second upper touch electrode 430. FIG. 9 illustrates an embodiment where three lines of the first upper touch electrode 410 overlap one mesh line of the second upper touch electrode 430. However, the disclosure is not limited to the number.

As shown in FIG. 9, the first upper touch electrode 410 may include a first line 410-1, a second line 410-2, and a third line 410-3. The first line 410-1, the second line 410-2, and the third line 410-3 may extend along the ±y direction. Lengths of the first line 410-1, the second line 410-2, and the third line 410-3 may be different from each other. Accordingly, the first line 410-1, the second line 410-2, and the third line 410-3 may contact the second upper touch electrode 430 at different points.

In an embodiment, the first line 410-1, the second line 410-2, and the third line 410-3 may contact the second upper touch electrode 430 through contact holes defined in the first upper touch insulating layer 420. A point at which such a contact hole is defined or a contact point may vary according to each line. In an embodiment, with respect to a contact point of the first line 410-1, a contact point of the second line 410-2 may be located in the +x direction and the −y direction. In an embodiment, with respect to a contact point of the second line 410-2, a contact point of the third line 410-3 may be located in the +x direction and the −y direction.

It will be understood by one of ordinary skill in the art that the first conductive layer 440 described with reference to FIGS. 6 and 7 may be combined with the embodiment described with reference to FIGS. 8 to 10.

Hereinafter, specific embodiments of the lower touch layer 100 will be described with reference to FIGS. 11 to 19.

Figure 11:
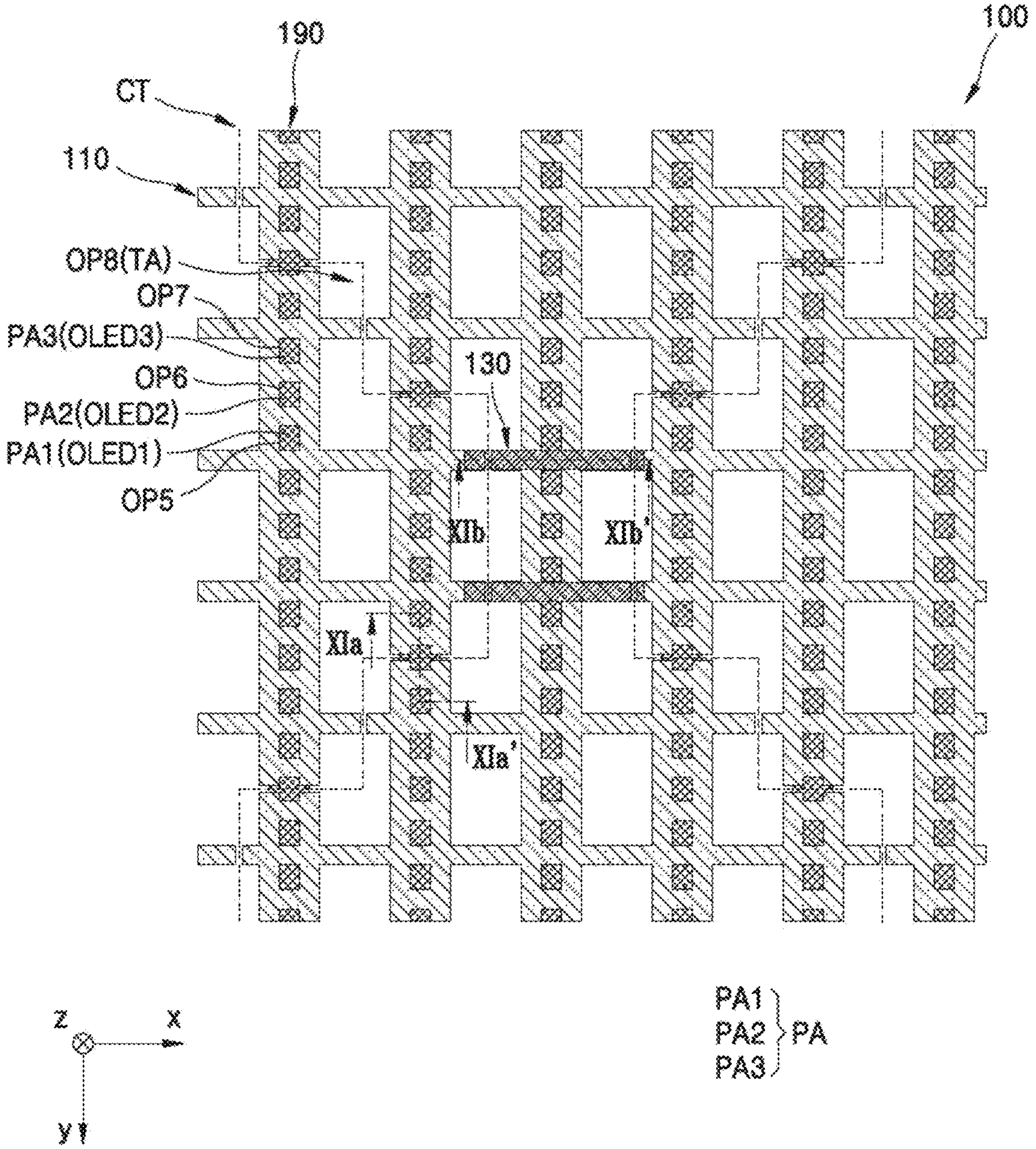
FIG. 11 is a bottom view illustrating a display apparatus according to an embodiment.
Figure 12A:
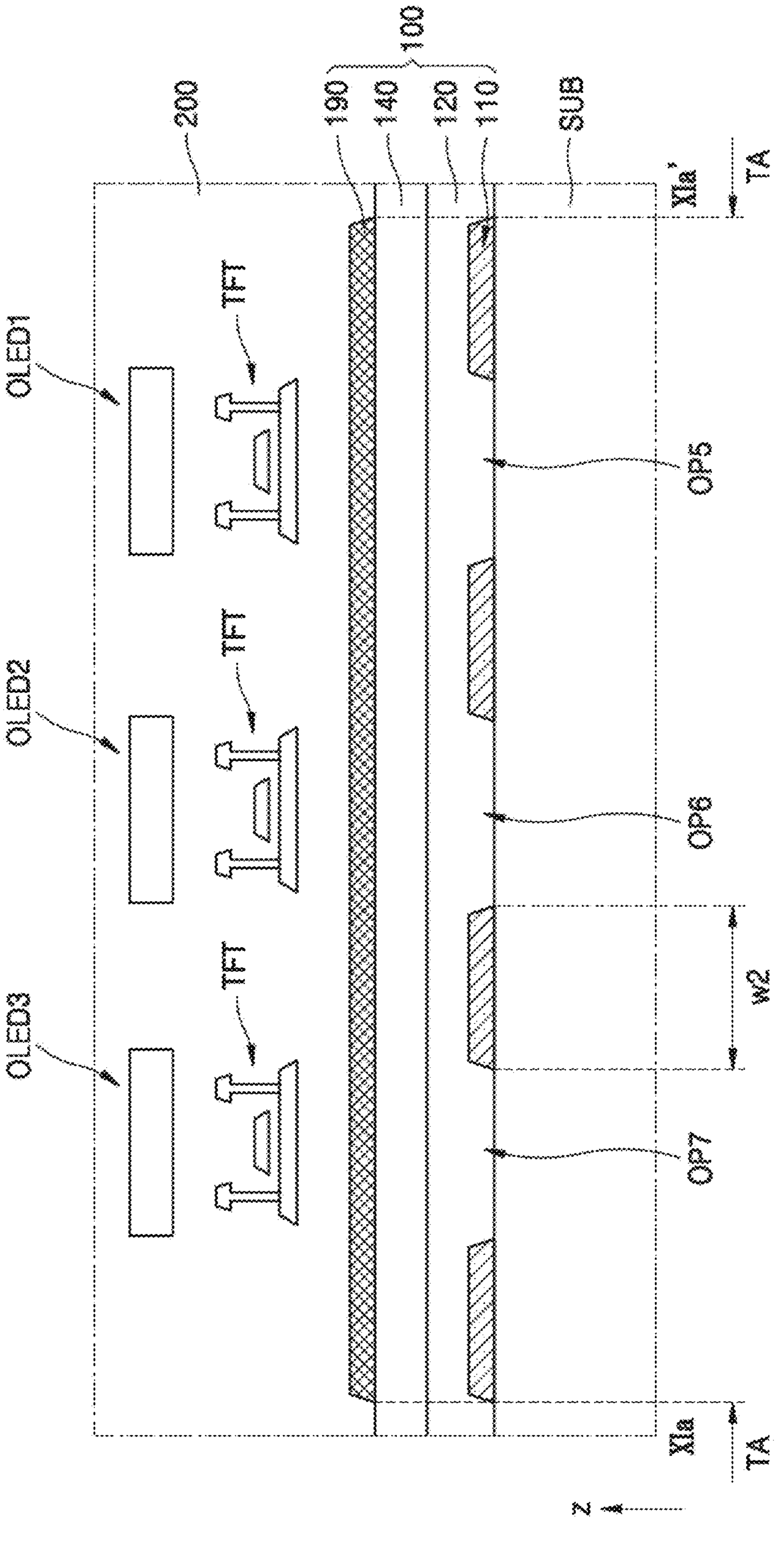
FIG. 12A is a cross-sectional view illustrating a display apparatus according to an embodiment.
Figure 12B:
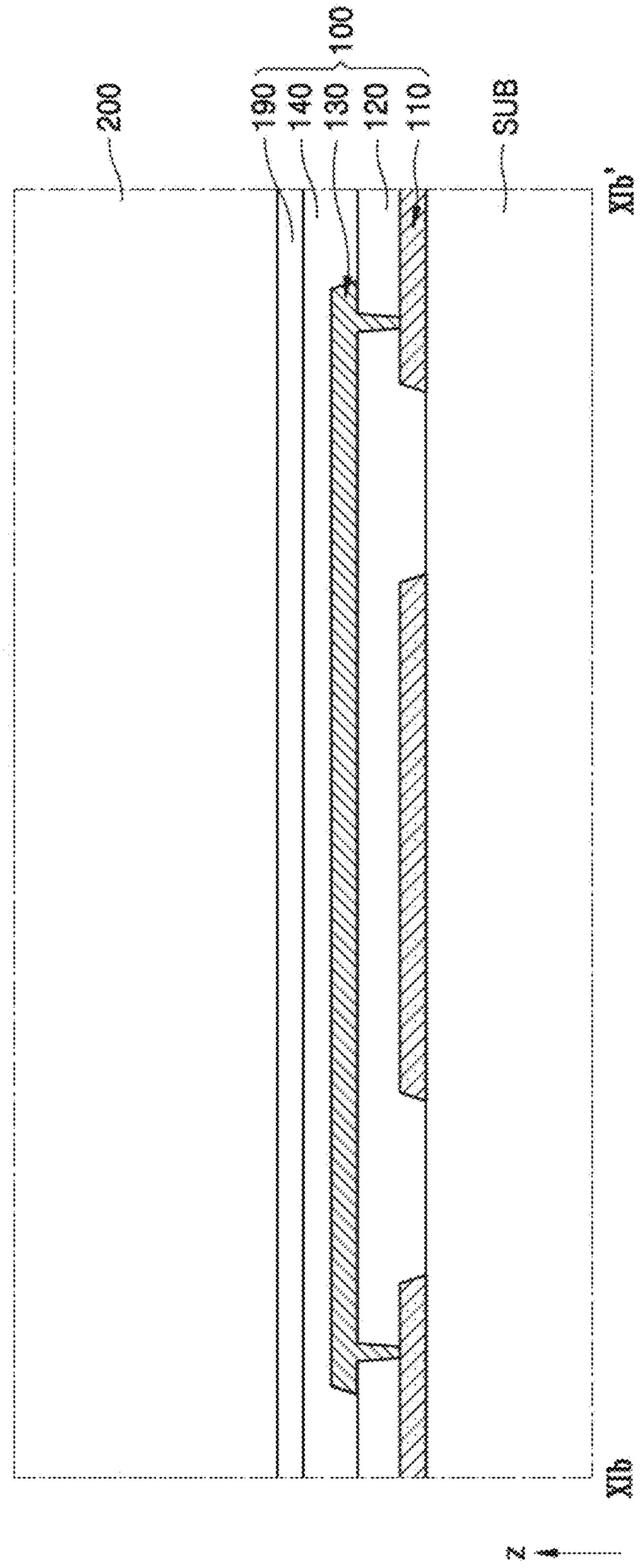
FIG. 12B is a cross-sectional view illustrating a display apparatus according to an embodiment.

FIG. 11 is a bottom view illustrating a display apparatus according to an embodiment. FIG. 12A is a cross-sectional view illustrating a display apparatus according to an embodiment. FIG. 12B is a cross-sectional view illustrating a display apparatus according to an embodiment.

FIG. 11 illustrates a part of the lower touch layer 100 for convenience of illustration and explanation. FIG. 11 may illustrate, for example, a mutual capacitance type touch layer. FIG. 12A is a cross-sectional view taken along line XIa-XIa' of FIG. 11. FIG. 12B is a cross-sectional view taken along line XIb-XIb' of FIG. 11.

Referring to FIGS. 11, 12A, and 12B, the lower touch layer 100 may include a first lower touch electrode 110, a first lower touch insulating layer 120, a second lower touch electrode 130, a second lower touch insulating layer 140, and a second conductive layer 190.

The first lower touch electrode 110 may be disposed on the substrate SUB. In an embodiment, an additional insulating layer may be disposed between the first lower touch electrode 110 and the substrate SUB. The first lower touch electrode 110 may have a substantially mesh shape. For example, some mesh lines of the first lower touch electrode 110 may extend in the ±x direction, and other mesh lines may extend in the ±y direction to entirely define a plurality of openings.

Openings of a mesh structure of the first lower touch electrode 110 may be disposed in areas correspond to a plurality of pixel areas PA and a plurality of transmissive areas TA. For example, a fifth opening OP5, a sixth opening OP6, a seventh opening OP7, and an eighth opening OP8 may be defined in the first lower touch electrode 110. The fifth opening OP5 may be disposed in an area corresponding to the first pixel area PA1. The sixth opening OP6 may be disposed in an area corresponding to the second pixel area PA2. The seventh opening OP7 may may be disposed in an area corresponding to the third pixel area PA3. The eighth opening OP8 may may be disposed in an area corresponding to the transmissive area TA.

A plurality of light-emitting elements disposed in the display element layer 200 may be disposed in areas corresponding to the plurality of openings of the first lower touch electrode 110. For example, the first organic light-emitting diode OLED1 may be disposed in an area corresponding to the fifth opening OP5. Likewise, the second organic light-emitting diode OLED2 may may be disposed in an area corresponding to the sixth opening OP6. Likewise, the third organic light-emitting diode OLED3 may be disposed in an area corresponding to the seventh opening OP7.

Referring to FIGS. 4, 5A, 11, and 12A together, each of the second upper touch electrode 430 and the first lower touch electrode 110 may have a mesh shape. The fifth opening OP5 of the first lower touch electrode 110 may be disposed in an area corresponding to the first opening OP1 of the second upper touch electrode 430. The sixth opening OP6 of the first lower touch electrode 110 may be disposed in an area corresponding to the second opening OP2 of the second upper touch electrode 430. The seventh opening OP7 of the first lower touch electrode 110 may be disposed in an area corresponding to the third opening OP3 of the second upper touch electrode 430. The eighth opening OP8 of the first lower touch electrode 110 may be disposed in an area corresponding to the fourth opening OP4 of the second upper touch electrode 430.

Widths of mesh lines of the second upper touch electrode 430 and widths of mesh lines of the first lower touch electrode 110 may be different from each other. As shown in FIG. 5A, a mesh line of the second upper touch electrode 430 may have a first width w1. Although it is assumed that a width of a mesh line of the second upper touch electrode 430 is constant as the first width w1 in the specification, the disclosure is not limited thereto. As shown in FIG. 12A, a mesh line of the first lower touch electrode 110 may have a second width w2. Although it is assumed that a width of a mesh line of the first lower touch electrode 110 is constant as the second width w2 in the specification, the disclosure is not limited thereto.

In an embodiment, the first width w1 may be less than the second width w2. In this case, the resistance of the first lower touch electrode 110 may be less than the resistance of the second upper touch electrode 430. Accordingly, the lower touch layer 100 may provide a higher touch sensitivity than the upper touch layer 400.

Because the first width w1 is less than the second width w2, sizes of openings of a mesh structure of the second upper touch electrode 430 may be greater than sizes of openings of a mesh structure of the first lower touch electrode 110. In an embodiment, the first opening OP1 may be greater than the fifth opening OP5. In an embodiment, the second opening OP2 may be greater than the sixth opening OP6. In an embodiment, the third opening OP3 may be greater than the seventh opening OP7. In an embodiment, the fourth opening OP4 may be greater than the eighth opening OP8. Accordingly, it is described in the specification that the first pixel area PA1, the second pixel area PA2, and the third pixel area PA3 are respectively defined by the first opening OP1, the second opening OP2, and the third opening OP3.

The first lower touch insulating layer 120 may be disposed on the first lower touch electrode 110. The first lower touch insulating layer 120 may cover the first lower touch electrode 110. In an embodiment, the first lower touch insulating layer 120 may be a planarization layer. A contact hole overlapping the first lower touch electrode 110 may be defined in a part of the first lower touch insulating layer 120.

The second lower touch electrode 130 may be disposed on the first lower touch insulating layer 120. The second lower touch electrode 130 may extend in the +x direction. A part of the second lower touch electrode 130 may extend between adjacent pixel areas PA. A part of the second lower touch electrode 130 may extend between adjacent transmissive areas TA. However, a shape of the second lower touch electrode 130 is not limited to that illustrated in FIG. 11. In another embodiment, the second lower touch electrode 130 may extend in the ±y direction.

In an embodiment, the lower touch layer 100 may be a mutual capacitance type lower touch layer. In this case, the first lower touch electrode 110 may be a sensor electrode, and the second lower touch electrode 130 may be a bridge electrode. In an embodiment, as shown in FIG. 11, the first lower touch electrode 110 may be cut along a virtual cutting line CT marked by a dashed line. Accordingly, a part of the first lower touch electrode 110 may generally extend integrally along the ±y direction. Another part of the first lower touch electrode 110 may be disposed in areas in which the part of the first lower touch electrodes are not disposed and generally disposed along the ±x direction and may be disconnected in some areas. For example, the first lower touch electrode 110 may be disconnected in an area crossing the second lower touch electrode 130.

As shown in FIG. 12B, the first lower touch electrode 110 and the second lower touch electrode 130 may directly contact and be (electrically) connected to each other through a contact hole formed in the first lower touch insulating layer 120. Accordingly, disconnected portions of the first lower touch electrode 110 may be connected through the second lower touch electrode 130.

Although the second lower touch electrode 130 extends in the ±x direction to connect the disconnected portions of the first lower touch electrode 110 in FIG. 11, the disclosure is not limited thereto. In another embodiment, a part of the first lower touch electrode 110 may generally extend integrally along the ±x direction, and another part of the first lower touch electrode 110 may be disposed in areas in which the part of the first lower touch electrodes 110 are not disposed and generally disposed along the ±y direction and may be disconnected in some areas. In this case, the second lower touch electrode 130 may extend in the ±y direction to connect disconnected portions of the first lower touch electrode 110.

The second lower touch insulating layer 140 may be disposed on the second lower touch electrode 130. The second lower touch insulating layer 140 may entirely cover the second lower touch electrode 130. In an embodiment, the second upper touch insulating layer 140 may be a planarization layer.

The second conductive layer 190 may be disposed on the second lower touch insulating layer 140. The second conductive layer 190 may overlap a plurality of pixel areas PA. In an embodiment, the second conductive layer 190 may overlap the first pixel area PA1, the second pixel area PA2, and the third pixel area PA3. In an embodiment, the second conductive layer 190 may overlap the first organic light-emitting diode OLED1, the second organic light-emitting diode OLED2, and the third organic light-emitting diode OLED3. In an embodiment, the second conductive layer 190 may overlap the fifth opening OP5, the sixth opening OP6, and the seventh opening OP7. In the present embodiment, the second conductive layer 190 may not be disposed in areas corresponding to the transmissive area TA or the eighth opening OP8.

The second conductive layer 190 may include a conductive material. In an embodiment, the second conductive layer 190 may include a metal. In an embodiment, the second conductive layer 190 may include titanium (Ti), molybdenum (Mo), and/or aluminum (Al), and may have a single or multi-layer structure including the above material. In an embodiment, the second conductive layer 190 may include a transparent conductive oxide. In an embodiment, the second conductive layer 190 may include ITO, $In_2O_3$, or IZO.

The second conductive layer 190 may prevent the lower touch layer 100 from being affected by voltages (and signals) applied to various circuits or signal lines disposed over the second conductive layer 190, that is, in the display element layer 200. Because the second conductive layer 190 may include a conductive material, the second conductive layer 190 may prevent electrical signals in the display element layer 200 from being transferred to the lower touch layer 100. The second conductive layer 190 may be floated or may receive a constant voltage. For example, the second conductive layer 190 may prevent electrical signals generated in thin-film transistors TFT respectively connected to the first organic light-emitting diode OLED1, the second organic light-emitting diode OLED2, and the third organic light-emitting diode OLED3 from being transferred to the lower touch layer 100. When electrical signals in the display element layer 200 are transferred to the first lower touch electrode 110 and/or the second lower touch electrode 130 of the lower touch layer 100, a touch sensitivity of the lower touch layer 100 may be deteriorated. The second conductive layer 190 may prevent or at least reduce this problem, thereby improving a touch sensitivity of the lower touch layer 100.

Figure 13:
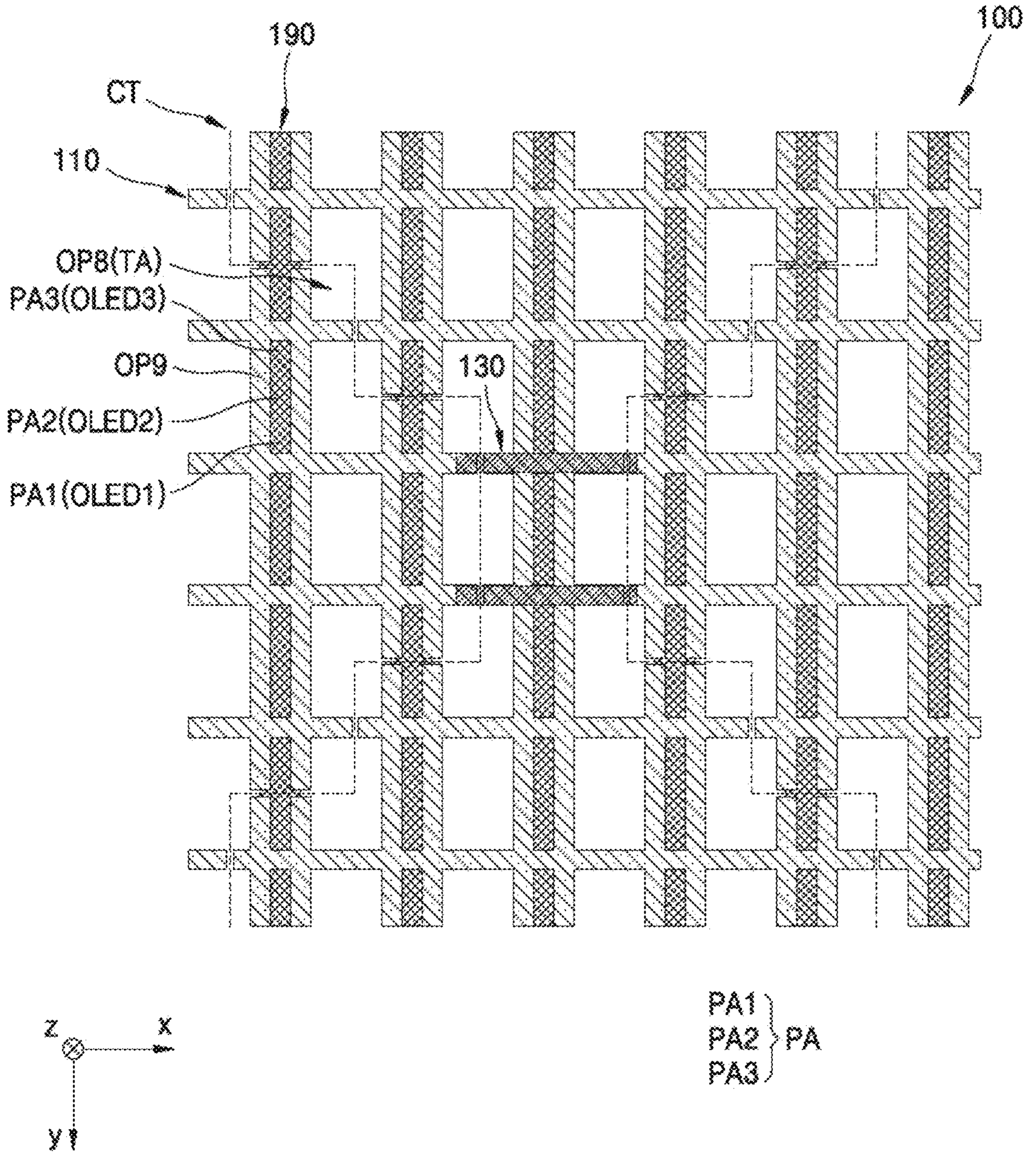
FIG. 13 is a bottom view illustrating a display apparatus according to an embodiment.

FIG. 13 is a bottom view illustrating a display apparatus according to an embodiment.

In FIG. 13, the same features as those described with reference to FIG. 11 will not be repeatedly described.

Referring to FIG. 13, the first lower touch electrode 110 may include a ninth opening OP9. The ninth opening OP9 may be disposed in areas corresponding to a plurality of pixel areas PA. In an embodiment, the ninth opening OP9 may be disposed in areas corresponding to the first pixel area PA1, the second pixel area PA2, and the third pixel area PA3. In other words, the ninth opening OP9 may be disposed in areas corresponding to a plurality of light-emitting elements. In an embodiment, the ninth opening OP9 may be disposed in areas corresponding to the first organic light-emitting diode OLED1, the second organic light-emitting diode OLED2, and the third organic light-emitting diode OLED3.

In an embodiment, an opening connecting the fifth opening OP5, the sixth opening OP6, and the seventh opening OP7 in the embodiment of FIG. 11 may be the ninth opening OP9 of FIG. 13. For example, in the embodiment of FIG. 11, the embodiment of FIG. 13 may be implemented by removing a part of the first lower touch electrode 110 disposed between the fifth opening OP5 and the sixth opening OP6 and a part of the first lower touch electrode 110 disposed between the sixth opening OP6 and the seventh opening OP7.

Figure 14:
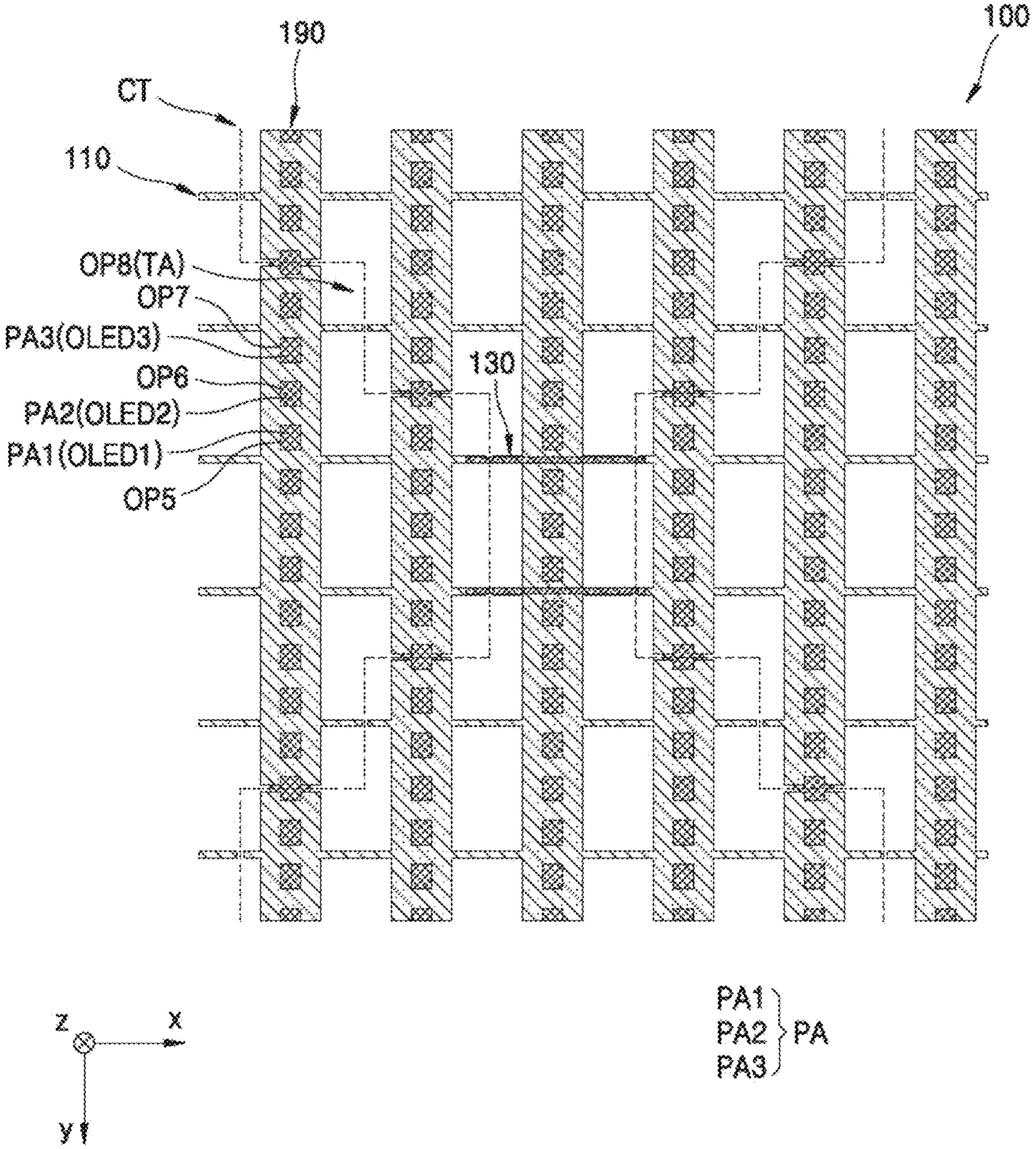
FIG. 14 is a bottom view illustrating a display apparatus according to an embodiment.

FIG. 14 is a bottom view illustrating a display apparatus according to an embodiment.

In FIG. 14, the same features as those described with reference to FIG. 11 will not be repeatedly described.

Referring to FIG. 14, mesh lines of the first lower touch electrode 110 may have different widths along extension directions. In an embodiment, the first lower touch electrode 110 may include a first portion extending in the ±y direction, a second portion extending in the ±x direction and disposed between a plurality of pixel areas PA, and a third portion extending in the ±x direction and disposed between a plurality of transmissive areas TA.

In an embodiment, a width of the third portion may be less than a width of the first portion. In an embodiment, a width of the third portion may be less than a width of the second portion. In an embodiment, a width of the first portion and a width of the second portion may be the same.

Figure 15:
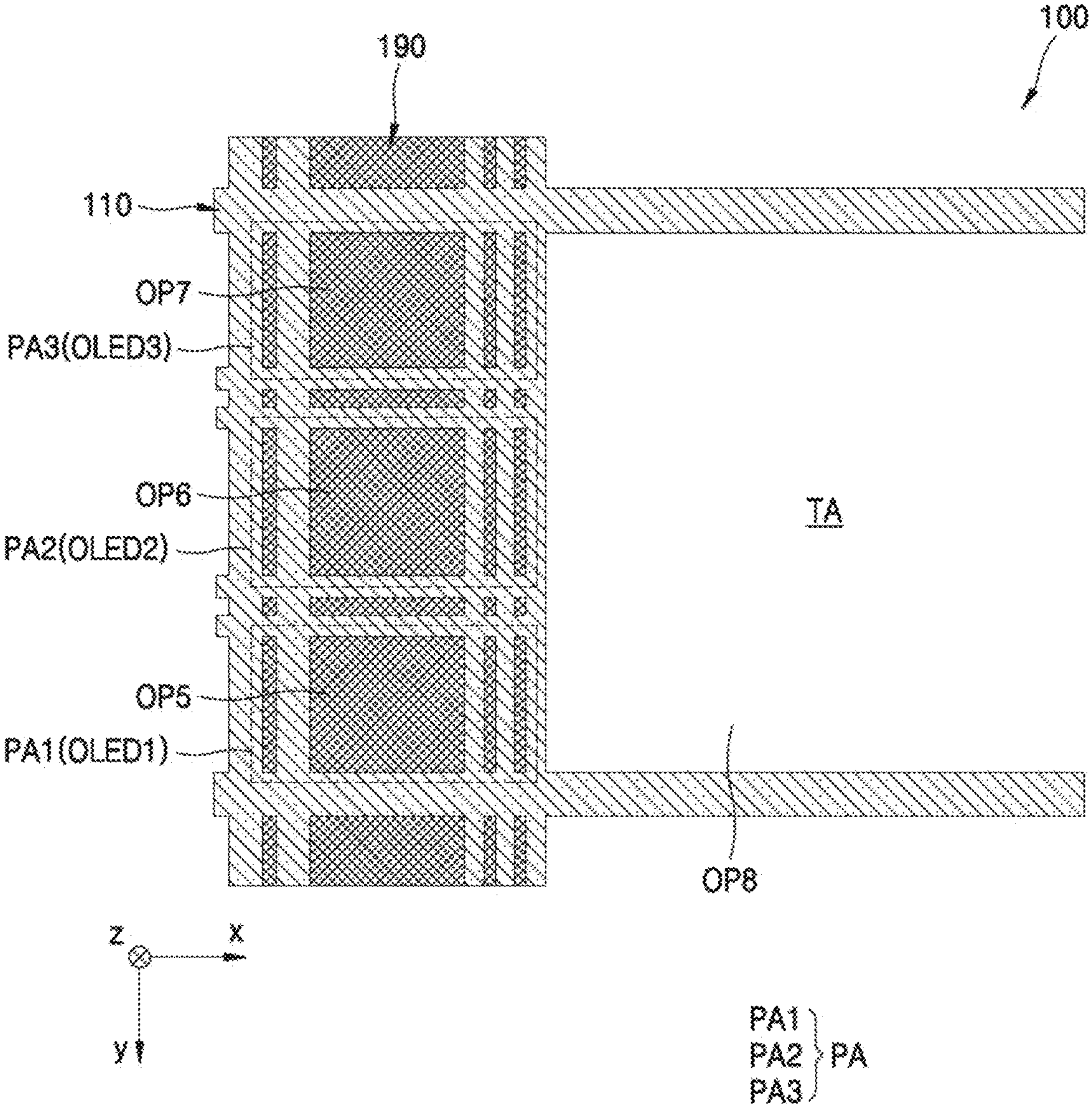
FIG. 15 is an enlarged bottom view illustrating a display apparatus according to an embodiment.
Figure 16:
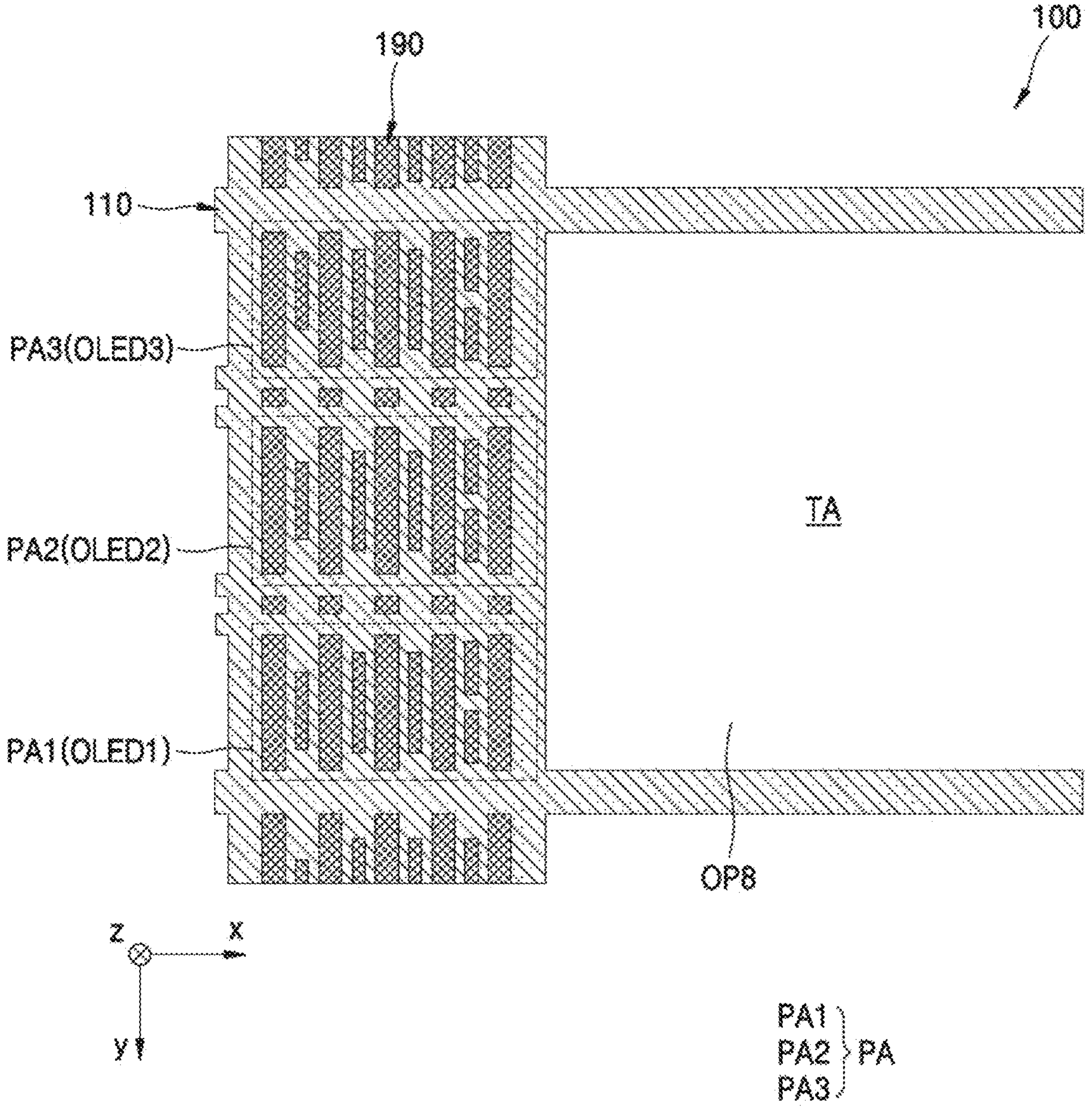
FIG. 16 is an enlarged bottom view illustrating a display apparatus according to an embodiment.

FIG. 15 is an enlarged bottom view illustrating a display apparatus according to an embodiment. FIG. 16 is an enlarged bottom view illustrating a display apparatus according to an embodiment.

Referring to FIGS. 15 and 16, a part of the first lower touch electrode 110 may overlap a light-emitting element. For example, the first lower touch electrode 110 may overlap the first organic light-emitting diode OLED1, the second organic light-emitting diode OLED2, and/or the third organic light-emitting diode OLED3. At the same time, the first lower touch electrode 110 may include an opening disposed in an area corresponding to each light-emitting element. Alternatively, an opening disposed in an area corresponding to a light-emitting element may be defined in a mesh line of the first lower touch electrode 110.

In the embodiment of FIG. 15, the first lower touch electrode 110 may include the fifth opening OP5, the sixth opening OP6, and the seventh opening OP7. Also, mesh lines of the first lower touch electrode 110 may define additional openings. For example, with reference to the fifth opening OP5, two lines may be disposed in the −x direction, three lines may be disposed in the −x direction, and two lines may be disposed in the +y direction. Spaces between the lines may be the additional openings. In other words, the first lower touch electrode 110 may include main openings (e.g., the fifth opening OP5, the sixth opening OP6, and the seventh opening OP7) disposed in areas corresponding to a central portion of each light-emitting element and sub-openings smaller than the main openings.

In the embodiment of FIG. 16, the first lower touch electrode 110 may not include the main openings. That is, lines of the first lower touch electrode 110 may overlap central portions of light-emitting elements. For example, the first lower touch electrode 110 may overlap a central portion of each of the first organic light-emitting diode OLED1, the second organic light-emitting diode OLED2, and the third organic light-emitting diode OLED3. The first lower touch electrode 110 may include a plurality of sub-openings overlapping light-emitting elements.

Through this arrangement, when the display apparatus 1 (see FIG. 1) is a double-sided light-emitting display apparatus, that is, when light emitted from light-emitting elements of the display element layer 200 (see FIG. 2) travels in the ±z direction, the amount of light covered by the first lower touch electrode 110 from among light traveling toward the −z direction may be reduced. In other words, the first lower touch electrode 110 may include open portions so as not to block light traveling toward the −z direction. In this case, in order to ensure transmission of light traveling toward the −z direction, the second conductive layer 190 may include a transparent conductive oxide. For example, the second conductive layer 190 may include ITO, $In_2O_3$, or IZO.

Although FIGS. 15 and 16 are enlarged views of FIG. 11, the disclosure is not limited thereto. It will be understood by one of ordinary skill in the art that features of the embodiments of FIGS. 15 and 16, that is, features of openings of the first lower touch electrode 110, may be combined with the embodiments of FIG. 13 or 14.

Figure 17:
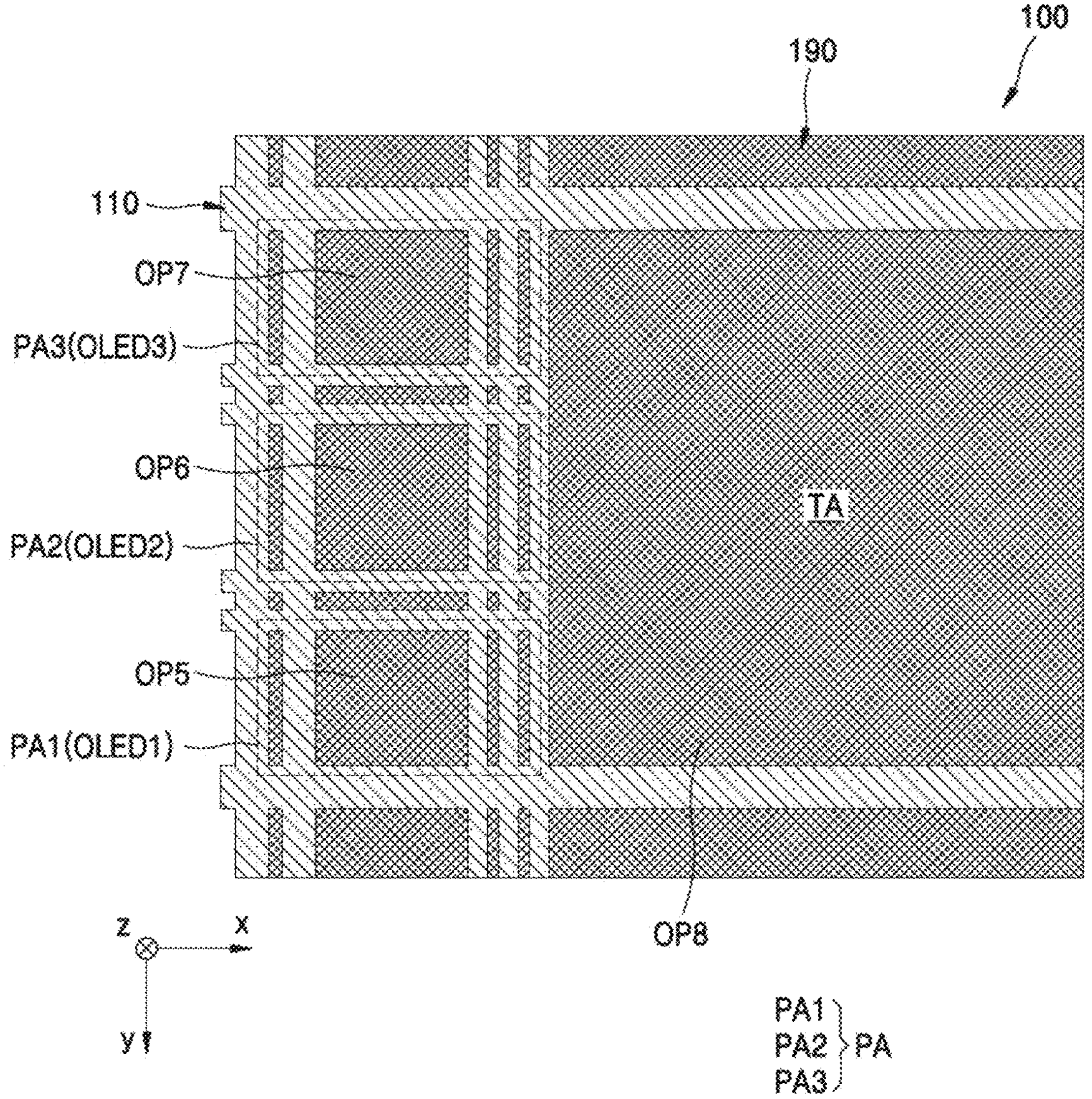
FIG. 17 is an enlarged bottom view illustrating a display apparatus according to an embodiment.

FIG. 17 is an enlarged bottom view illustrating a display apparatus according to an embodiment.

Referring to FIG. 17, the second conductive layer 190 may entirely overlap a plurality of pixel areas PA and a plurality of transmissive areas TA. In other words, the second conductive layer 190 may be integrally formed over a plurality of pixel areas PA and plurality of transmissive areas TA. In this case, in order to ensure a light-transmitting property in the transmissive area TA, the second conductive layer 190 may include a transparent conductive oxide. For example, the second conductive layer 190 may include ITO, $In_2O_3$, or IZO.

In FIG. 17, although the first lower touch electrode 110 is the same as that in the embodiment of FIG. 15, the disclosure is not limited thereto. It will be understood by one of ordinary skill in the art that the feature of the embodiment of FIG. 17, that is, the feature regarding the second conductive layer 190, may be combined with the embodiments of FIGS. 11 to 16.

Figure 18:
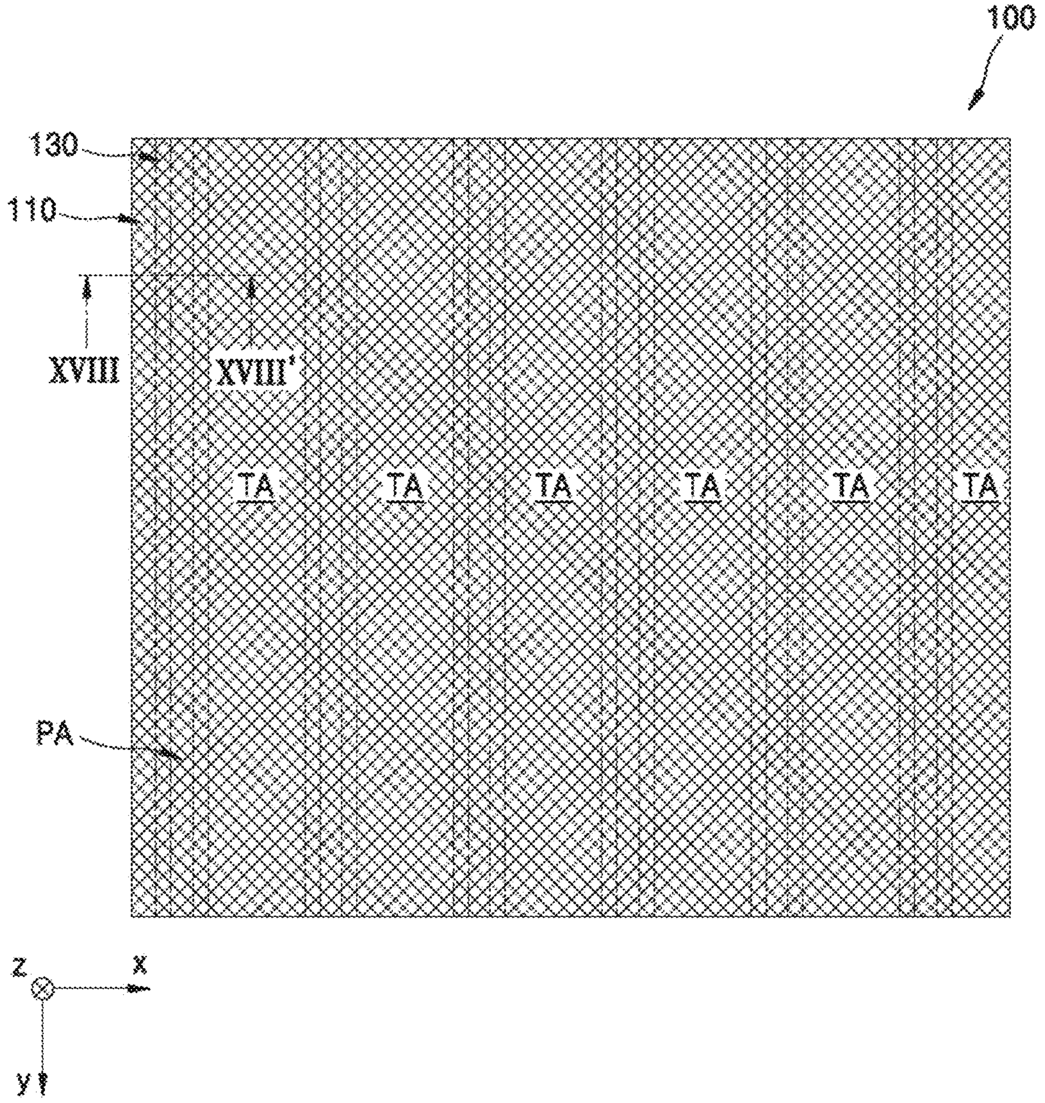
FIG. 18 is a bottom view illustrating a display apparatus according to an embodiment.
Figure 19:
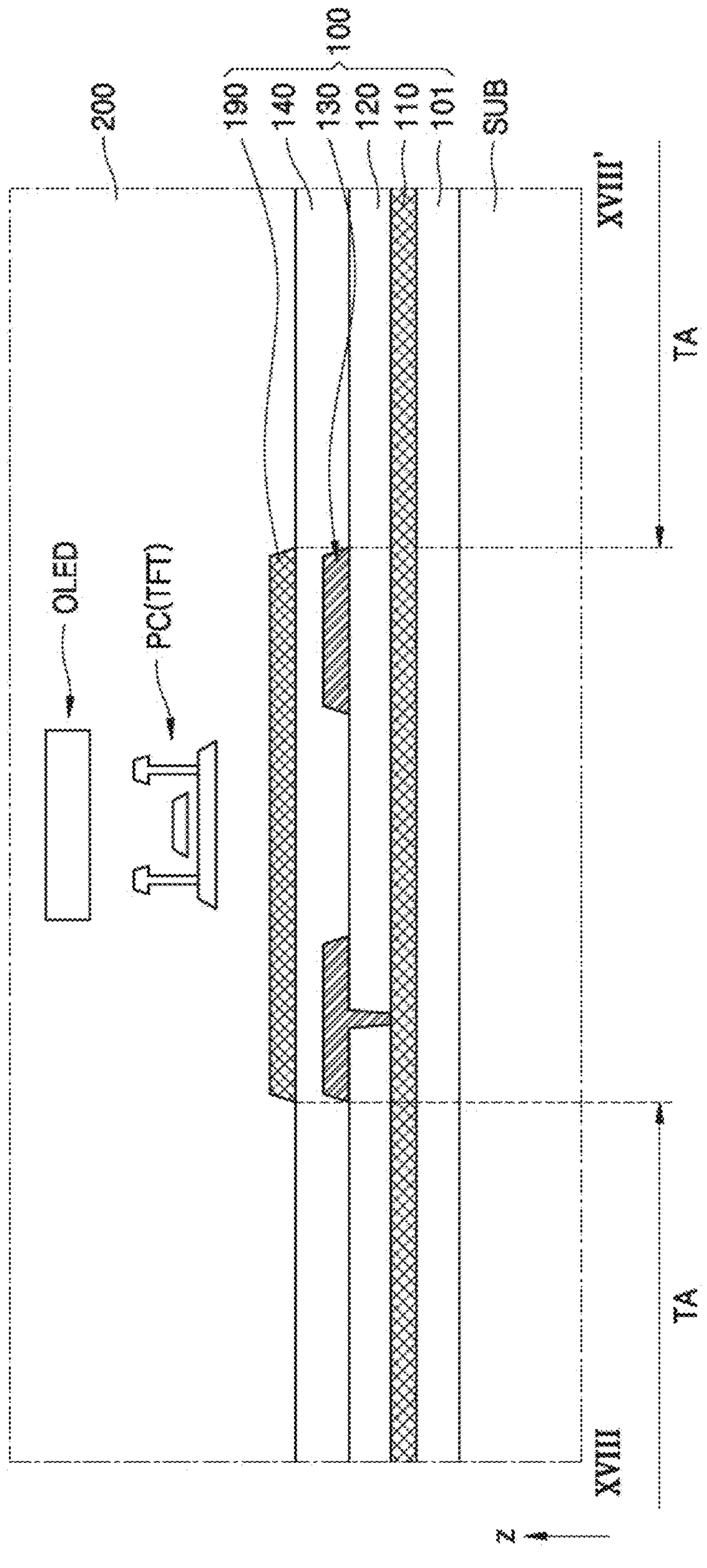
FIG. 19 is a cross-sectional view illustrating a display apparatus according to an embodiment.

FIG. 18 is a bottom view illustrating a display apparatus according to an embodiment. FIG. 19 is a cross-sectional view illustrating a display apparatus according to an embodiment. FIG. 19 is a cross-sectional view illustrating a display apparatus taken along line XVIII-XVIII' of FIG. 18.

Referring to FIGS. 18 and 19, the first lower touch electrode 110 may be integrally disposed over a plurality of pixel areas PA and plurality of transmissive areas TA. As shown in FIG. 19, an additional insulating layer 101 may be disposed to entirely cover the substrate SUB, and the first lower touch electrode 110 may be disposed to entirely cover the additional insulating layer 101. In this case, in order to ensure a light-transmitting property in the pixel area PA and a light-transmitting property in the transmissive area TA, the first lower touch electrode 110 may include a transparent conductive oxide. For example, the first lower touch electrode 110 may include ITO, $In_2O_3$, or IZO.

The first lower touch insulating layer 120 may be disposed on the first lower touch electrode 110, and the second lower touch electrode 130 may be disposed on the first lower touch insulating layer 120. The second lower touch electrode 130 may be connected to the first lower touch electrode 110 through a contact hole defined in the first lower touch insulating layer 120 in a certain area. FIG. 18 illustrates an example where the second lower touch electrode 130 entirely extends in the ±y direction. In another embodiment, the second lower touch electrode 130 may have the same shape as that illustrated in FIG. 11.

The second lower touch insulating layer 140 may be disposed on the second lower touch electrode 130, and the second conductive layer 190 may be disposed on the second lower touch insulating layer 140. FIG. 19 illustrates an example where the second conductive layer 190 covers the second lower touch electrode 130. In another embodiment, the second conductive layer 190 may entirely cover the first lower touch electrode 110 (e.g., as in the embodiment of FIG. 17).

Specific embodiments of layers other than the lower touch layer 100 and the upper touch layer 400, for example, the display element layer 200, the encapsulation layer 300, and the optical functional layer 500, will be described with reference to FIGS. 20 to 24.

Figure 20:
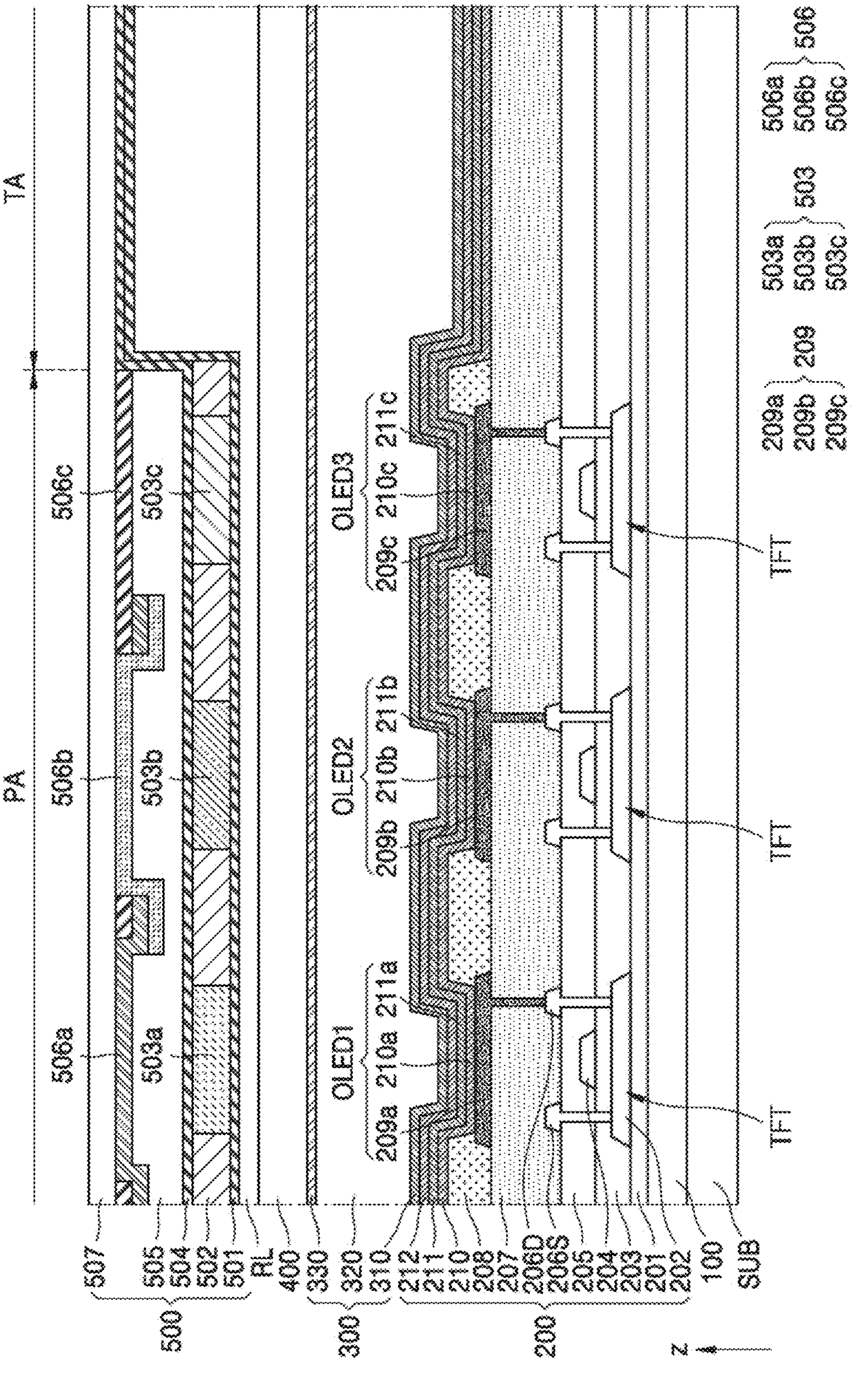
FIG. 20 is a cross-sectional view illustrating a display apparatus according to an embodiment.

FIG. 20 is a cross-sectional view illustrating a display apparatus according to an embodiment.

Referring to FIG. 20, the lower touch layer 100 may be disposed on the substrate SUB, and the display element layer 200 may be disposed on the lower touch layer 100. The display element layer 200 may include a plurality of light-emitting elements disposed in the pixel area PA and thin-film transistors TFT connected to the plurality of light-emitting elements. For example, the display element layer 200 may include the first organic light-emitting diode OLED1, the second organic light-emitting diode OLED2, and the third organic light-emitting diode OLED3, and may include thin-film transistors TFT respectively connected to the first organic light-emitting diode OLED1, the second organic light-emitting diode OLED2, and the third organic light-emitting diode OLED3. The thin-film transistors TFT shown in FIG. 20 may be a part of the sub-pixel circuit PC described with reference to FIG. 3. In an embodiment, the thin-film transistor TFT of FIG. 20 may correspond to the first transistor T1 described with reference to FIG. 3.

A buffer layer 201 may be disposed on the lower touch layer 100. The buffer layer 201 may protect a top surface of the lower touch layer 100 and may be provided as a planarization layer. The buffer layer 201 may include an inorganic insulating material such as silicon oxide ($SiO_2$), silicon nitride ($SiN_x$), and/or silicon oxynitride (SION), and may have a single or multi-layer structure including the above materials.

The thin-film transistors TFT may be disposed on the buffer layer 201. The thin-film transistor TFT may include an active layer 202, a gate electrode 204, a source electrode 206S, and a drain electrode 206D. The active layer 202 may be disposed on the buffer layer, and may be patterned to correspond to each thin-film transistor TFT. The active layer 202 may include a drain region overlapping the drain electrode 206D, a source region overlapping the source electrode 206S, and a channel region between the drain region and the source region. The source region and the drain region of the active layer 202 may be doped with impurities.

A gate insulating layer 203 may be disposed on the active layer 202. The gate insulating layer 203 may include an inorganic insulating material such as silicon oxide ($SiO_2$), silicon nitride ($SiN_x$), and/or silicon oxynitride (SION), and may have a single or multi-layer structure including the above materials. FIG. 20 illustrates a case where a gate insulating layer 203 entirely covers the active layer 202. In another embodiment, the gate insulating layer 203 may be patterned to correspond to the active layer 202 (or the channel region of the active layer 202).

The gate electrode 204 may be disposed on the gate insulating layer 203. The gate electrode 204 may overlap the channel region of the active layer 202. In other words, the gate electrode 204 may be patterned to overlap the channel region of the active layer 202. The gate electrode 204 may include at least one of aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), or copper (Cu), and may have a single or multi-layer structure including the above materials.

An interlayer insulating layer 205 may cover the gate electrode 204. The interlayer insulating layer 205 may include an inorganic insulating material such as silicon oxide ($SiO_2$), silicon nitride ($SiN_x$), and/or silicon oxynitride (SION), and may have a single or multi-layer structure including the above materials.

The gate insulating layer 203 and the interlayer insulating layer 205 may include contact holes overlapping the source region and/or the drain region of the active layer 202. The source electrode 206S and the drain electrode 206D may be disposed on the interlayer insulating layer 205. The source electrode 206S may overlap the source region of the active layer 202 and the drain electrode 206D may overlap the drain region of the active layer 202. The source electrode 206S and the drain electrode 206D may be (e.g., electrically) connected to the active layer 202 through contact holes formed in the gate insulating layer 203 and the interlayer insulating layer 205.

An organic insulating layer 207 may be disposed on the interlayer insulating layer 205. The organic insulating layer 207 may cover the interlayer insulating layer 205, the source electrode 206S, and the drain electrode 206D. The organic insulating layer 207 may be a planarization layer having a substantially flat top surface. The organic insulating layer 207 may include, for example, an organic material such as acryl, benzocyclobutene (BCB), or hexamethyldisiloxane (HMDSO). In FIG. 20, the organic insulating layer 207 is a single layer. In another embodiment, the organic insulating layer 207 may have a multi-layer structure.

The first organic light-emitting diode OLED1, the second organic light-emitting diode OLED2, and the third organic light-emitting diode OLED3 may be disposed on the organic insulating layer 207. Each of the first to third organic light-emitting diodes OLED1, OLED2, and OLED3 may have a structure in which a sub-pixel electrode 209, an emission layer 210, and a counter electrode 211 are stacked. For example, the first organic light-emitting diode OLED1 may have a structure in which a first sub-pixel electrode 209*a*, a first emission layer 210*a*, and a first counter electrode 211*a* are stacked. Likewise, the second organic light-emitting diode OLED2 may have a structure in which a second sub-pixel electrode 209*b*, a second emission layer 210*b*, and a second counter electrode 211*b* are stacked. Likewise, the third organic light-emitting diode OLED3 may have a structure in which a third sub-pixel electrode 209*c*, a third emission layer 210*c*, and a third counter electrode 211*c* are stacked.

The sub-pixel electrodes 209 may be disposed on the organic insulating layer 207 and may be spaced apart from each other. For example, the first sub-pixel electrode 209*a*, the second sub-pixel electrode 209*b*, and the third sub-pixel electrode 209*c* may be disposed on the organic insulating layer 207 to be spaced apart from each other. Each of the sub-pixel electrodes 209 may be (e.g., electrically) connected to a corresponding thin-film transistor TFT through a contact hole defined in the organic insulating layer 207.

When each of the sub-pixel electrodes 209 is formed as a (semi-) transparent electrode, the sub-pixel electrode 209 may include a transparent conductive oxide such as ITO, $In_2O_3$, or IZO. When each of the sub-pixel electrodes 209 is formed as a reflective electrode, the sub-pixel electrode 209 may include a transparent conductive layer formed of a transparent conductive oxide such as, ITO, $In_2O_3$, or IZO and a reflective layer formed of a metal such as Al or Ag.

The emission layer 210 may be disposed on the sub-pixel electrodes 209. The emission layer 210 may cover the sub-pixel electrodes 209 on the organic insulating layer 207. The emission layer 210 may emit light of a certain color.

The emission layer 210 may be integrally formed over a plurality of sub-pixel electrodes 209. In this case, a part of the emission layer 210 overlapping the first sub-pixel electrode 209*a* may be referred to as the first emission layer 210*a*, a part of the emission layer 210 overlapping the second sub-pixel electrode 209*b* may be referred to as the second emission layer 210*b*, and a part of the emission layer 210 overlapping the third sub-pixel electrode 209*c* may be referred to as the third emission layer 210*c*. However, in another embodiment, the emission layer 210 may be patterned to correspond to each sub-pixel electrode 209.

In an embodiment, the emission layer 210 may include a high molecular weight organic material or a low molecular weight organic material. The emission layer 210 may include an organic emission layer. For example, the emission layer 210 may include a polymer material such as a polyphenylene vinylene (PPV)-based material or a polyfluorene-based material. However, the disclosure is not limited thereto, and the emission layer 210 may include an inorganic light-emitting material or may include quantum dots.

The first organic light-emitting diode OLED1 may emit light through the first emission layer 210*a*. The second organic light-emitting diode OLED2 may emit light through the second emission layer 210*b*. The third organic light-emitting diode OLED3 may emit light through the third emission layer 210*c*.

In an embodiment, a functional layer (not shown) may be disposed over and/or under the emission layer 210. The functional layer may include a hole injection layer (HIL), a hole transport layer (HTL), an electron transport layer (ETL), and/or an electron injection layer (EIL). The functional layer may be integrally formed over the sub-pixel electrodes 209, or may be patterned to correspond to each of the sub-pixel electrodes 209.

The counter electrode 211 may be disposed on the sub-pixel electrodes 209 and may overlap the sub-pixel electrodes 209. The counter electrode 211 may be disposed on the emission layer 210. The counter electrode 211 may include a conductive material having a low work function. For example, the counter electrode 211 may include a metal layer including silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or an alloy thereof. Alternatively, the counter electrode 211 may further include a layer including ITO, IZO, ZnO, and/or $In_2O_3$ on the metal layer including the above material.

The counter electrode 211 may be integrally formed over a plurality of sub-pixel electrodes 209. In this case, a part of the counter electrode 211 overlapping the first sub-pixel electrode 209*a* is referred to as the first counter electrode 211*a*, a part of the counter electrode 211 overlapping the second sub-pixel electrode 209*b* is referred to as the second counter electrode 211*b*, and a part of the counter electrode 211 overlapping the third sub-pixel electrode 209*c* is referred to as the third counter electrode 211*c*.

A pixel-defining layer 208 may be disposed on the organic insulating layer 207. The pixel-defining layer 208 may include openings corresponding to the first to third organic light-emitting diodes OLED1, OLED2, and OLED3. Each of the openings of the pixel-defining layer 208 may be disposed in an area corresponding to at least a portion, for example, a central portion, of each of the sub-pixel electrodes 209. In an embodiment, an emission area of each of the first to third organic light-emitting diodes OLED1, OLED2, and OLED3 may be defined by the opening of the pixel-defining layer 208. The pixel-defining layer 208 may include an organic insulating material and/or an inorganic insulating material. The pixel-defining layer 208 may include an organic material such as polyimide or hexamethyldisiloxane (HMDSO). The pixel-defining layer 208 may not be disposed in the transmissive area TA.

A capping layer 212 may be disposed on the counter electrode 211. The capping layer 212 may cover the counter electrode 211. In an embodiment, the capping layer 212 may improve the luminous efficiency of the first to third organic light-emitting diodes OLED1, OLED2, and OLED3 due to constructive interference.

The capping layer 212 may be an organic capping layer including an organic material, an inorganic capping layer including an inorganic material, or a composite capping layer including an organic material and an inorganic material. For example, the capping layer 212 may include a carbocyclic compound, a heterocyclic compound, an amine group-containing compound, a porphine derivative, a phthalocyanine derivative, a naphthalocyanine derivative, an alkali metal complex, an alkaline earth metal complex, or any combination thereof.

The encapsulation layer 300 may be disposed on the counter electrode 211. The encapsulation layer 300 may cover the first to third organic light-emitting diodes OLED1, OLED2, and OLED3. The encapsulation layer 300 may include at least one inorganic encapsulation layer and at least one organic encapsulation layer. In an embodiment, the encapsulation layer 300 may include a first inorganic encapsulation layer 310, an organic encapsulation layer 320 on the first inorganic encapsulation layer 310, and a second inorganic encapsulation layer 330 on the organic encapsulation layer 320.

The first inorganic encapsulation layer 310 and/or the second inorganic encapsulation layer 330 may include an inorganic insulating material such as aluminum oxide ($Al_2O_3$), titanium oxide ($TiO_2$), tantalum oxide ($Ta_2O_5$), hafnium oxide ($HfO_2$), zinc oxide ($ZnO_2$), silicon oxide ($SiO_2$), silicon nitride ($SiN_x$), and/or silicon oxynitride (SiON). The organic encapsulation layer 320 may include a polymer-based material. Examples of the polymer-based material may include an acrylic resin, an epoxy resin, polyimide, and polyethylene. In an embodiment, the organic encapsulation layer 320 may include acrylate. The organic encapsulation layer 320 may be formed by curing a monomer or applying a polymer. The organic encapsulation layer 320 may be transparent.

The upper touch layer 400 may be disposed on the encapsulation layer 300, and a resin layer RL may be disposed on the upper touch layer 400. The optical functional layer 500 may be disposed on the resin layer RL. In an embodiment, the resin layer RL may adhere the upper touch layer 400 and the optical functional layer 500 to each other. In an embodiment, the optical functional layer 500 may be separately formed, and then may be adhered to the upper touch layer 400 through the resin layer RL.

The optical functional layer 500 may include a first insulating layer 501, a bank layer 502, a color element layer 503, a second insulating layer 504, a third insulating layer 505, a color filter layer 506, and a fourth insulating layer 507.

The first insulating layer 501 may be disposed on the upper touch layer 400, and may include a light-transmitting insulating material. The first insulating layer 501 may be disposed on the resin layer RL.

The bank layer 502 may be disposed on the first insulating layer 501. The bank layer may include a light-blocking material. The bank layer 502 may include openings respectively disposed in areas corresponding to the first to third organic light-emitting diodes OLED1, OLED2, and OLED3.

Each of the openings of the bank layer 502 may be filled with the color element layer 503. A first color element 503*a* may be disposed in the opening of the bank layer 502 and may overlap the first organic light-emitting diode OLED1. A second color element 503*b* may be disposed in the opening of the bank layer 502 and may overlap the second organic light-emitting diode OLED2. A third color element 503*c* may be disposed in the opening of the bank layer 502 and may overlap the third organic light-emitting diode OLED3. Top surfaces of the color element layer 503 and the bank layer 502 may be covered by the second insulating layer 504. The second insulating layer 504 may include a light-transmitting insulating material.

The bank layer 502 and the color element layer 503 may not be disposed in the transmissive area TA.

The first color element 503*a* and the second color element 503*b* may include quantum dots. For example, the first color element 503*a* may include first quantum dots and the second color element 503*b* may include second quantum dots. Quantum dots may be excited by incident light to emit light having a specific wavelength. For example, the first quantum dots of the first color element 503*a* may be excited by incident light to emit red light. The second quantum dots of the second color element 503*b* may be excited by incident light to emit green light.

A core of a quantum dot may be selected from among a group II-VI compound, a group III-V compound, a group IV-VI compound, a group IV element, a group IV compound, and a combination thereof.

The group II-VI compound may be selected from among a binary compound selected from the group consisting of CdSe, CdTe, ZnS, ZnSe, ZnTe, ZnO, HgS, HgSe, HgTe, MgSe, MgS, and a mixture thereof; a ternary compound selected from the group consisting of AgInS, CuInS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof; and a quaternary compound selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof.

The group III-V compound may be selected from among a binary compound selected from the group consisting of GaN, GaP, GaAs, GaSb, AlN, AlP, AlAs, AlSb, InN, InP, InAs, InSb, and a mixture thereof; a ternary compound selected from the group consisting of GaNP, GaNAs, GaNSb, GaPAs, GaPSb, AlNP, AlNAs, AlNSb, AlPAs, AlPSb, InGaP, InNP, InNAs, InNSb, InPAs, InPSb, GaAlNP, and a mixture thereof; and a quaternary compound selected from the group consisting of GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof.

The group IV-VI compound may be selected from among a binary compound selected from the group consisting of SnS, SnSe, SnTe, PbS, PbSe, PbTe, and a mixture thereof; a ternary compound selected from the group consisting of SnSeS, SnSeTe, SnSTe, PbSeS, PbSeTe, PbSTe, SnPbS, SnPbSe, SnPbTe, and a mixture thereof; and a quaternary compound selected from the group consisting of SnPbSSe, SnPbSeTe, SnPbSTe, and a mixture thereof. The group IV element may be selected from the group consisting of silicon (Si), germanium (Ge), and a mixture thereof. The group IV compound may be a binary compound selected from the group consisting of SiC, SiGe, and a mixture thereof.

In this case, the binary compound, the ternary compound, or the quaternary compound may exist in particles at a uniform concentration, or may exist in the same particle divided into two states where concentration distributions are partially different. Also, the quantum dot may have a core/shell structure in which one quantum dot surrounds another quantum dot. An interface between the core and the shell may have a concentration gradient in which a concentration of an element in the shell gradually decreases toward the center.

In some embodiments, a quantum dot may have a core-shell structure including a core including a nanocrystal and a shell surrounding the core. The shell of the quantum dot may function as a protective layer for maintaining semiconductor characteristics by preventing chemical denaturation of the core and/or a charging layer for giving electrophoretic characteristics to the quantum dot. The shell may have a single or multi-layer structure. An interface between the core and the shell may have a concentration gradient in which a concentration of an element in the shell gradually decreases toward the center. Examples of the shell of the quantum dot may include an oxide of a metal or a non-metal, a semiconductor compound, and a combination thereof.

Examples of the oxide of the metal or the non-metal may include, but are not limited to, a binary compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, or NiO and a ternary compound such as $MgAl_2O_4$, $CoFe_2O_4$, $NiFe_2O_4$, or $CoMn_2O_4$.

Examples of the semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AIP, and AlSb.

The third color element 503*c* may include a light-transmitting material. For example, the third color element 503*c* may include a light-transmitting inorganic insulating material such as silicon oxide ($SiO_2$), silicon nitride ($SiN_x$), and/or silicon oxynitride (SiON), or may include a light-transmitting organic insulating material such as polyimide (PI). The third color element 503*c* may further include scattering particles such as titanium oxide ($TiO_2$). In an embodiment, the first color element 503*a* and/or the second color element 503*b* may also include scattering particles.

The third insulating layer 505 may be disposed on the second insulating layer 504. The third insulating layer 505 may include openings in an area corresponding to the transmissive area TA. The color filter layer 506 may include a first color filter 506*a*, a second color filter 506*b*, and a third color filter 506*c*. The first color filter 506*a* may be disposed on the second color filter 506*b*. The third color filter 506*c* may be disposed on the first color filter 506*a*.

The first color filter 506*a* may overlap the first color element 503*a* and the first organic light-emitting diode OLED1. The second color filter 506*b* may overlap the second color element 503*b* and the second organic light-emitting diode OLED2. The third color filter 506*c* may overlap the third color element 503*c* and the third organic light-emitting diode OLED3.

Each of the first to third color filters 506*a*, 506*b*, and 506*c* may selectively transmit light of a pre-determined wavelength band (or color). For example, the first color filter 506*a* may transmit red light, the second color filter 506*b* may transmit green light, and the third color filter 506*c* may transmit blue light.

The first to third color filters 506*a*, 506*b*, and 506*c* may overlap each other in an area overlapping the bank layer 502. Because the first to third color filters 506*a*, 506*b*, and 506*c* may transmit light of different wavelength bands (or colors), light may not pass through the color filter layer 506 in an area overlapping the bank layer 502. This overlapping structure of the color filter layer 506 may enable the color filter layer 506 to function as a light-blocking layer in an area overlapping the bank layer 502.

The color filter layer 506 may not be disposed in the transmissive area TA.

The fourth insulating layer 507 may be disposed on the color filter layer 506. The fourth insulating layer 507 may cover the color filter layer 506 and the second insulating layer 504. The fourth insulating layer 507 may include a light-transmitting insulating material.

Figure 21:
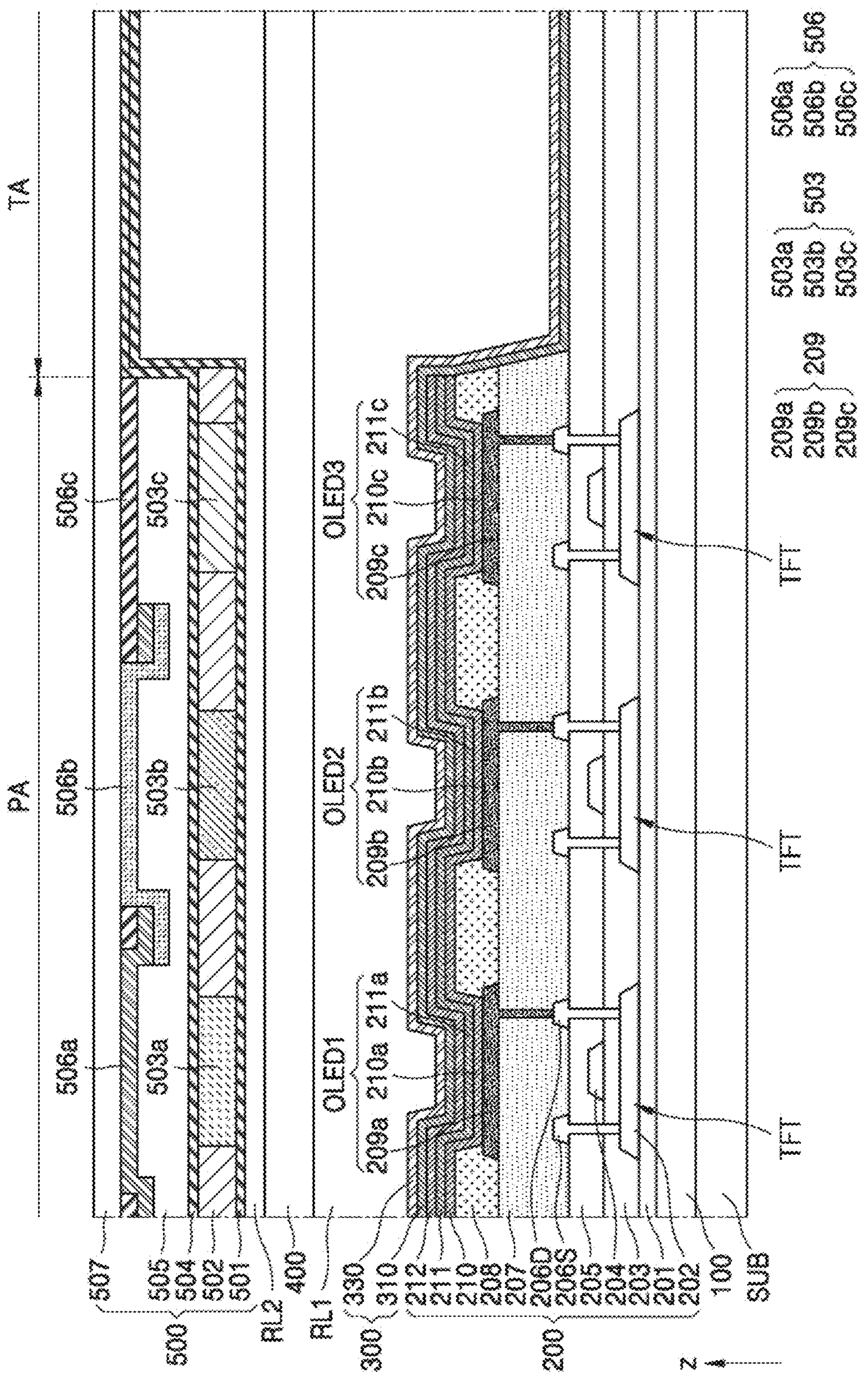
FIG. 21 is a cross-sectional view illustrating a display apparatus according to an embodiment.

FIG. 21 is a cross-sectional view illustrating a display apparatus according to an embodiment.

Referring to FIG. 21, in the transmissive area TA, the organic insulating layer 207, the emission layer 210, the counter electrode 211, and the capping layer 212 may not be disposed. In other words, in the present embodiment, the organic insulating layer 207, the emission layer 210, the counter electrode 211, and the capping layer 212 may not be disposed in the transmissive area TA.

The organic encapsulation layer 320 (see FIG. 20) may not be disposed over the pixel area PA and the transmissive area TA. Accordingly, the second inorganic encapsulation layer 330 may be disposed directly on the first inorganic encapsulation layer 310. A first resin layer RL1 may fill a space between the second inorganic encapsulation layer 330 and the upper touch layer 400. A second resin layer RL2 may be disposed between the upper touch layer 400 and the optical functional layer 500.

Figure 22:
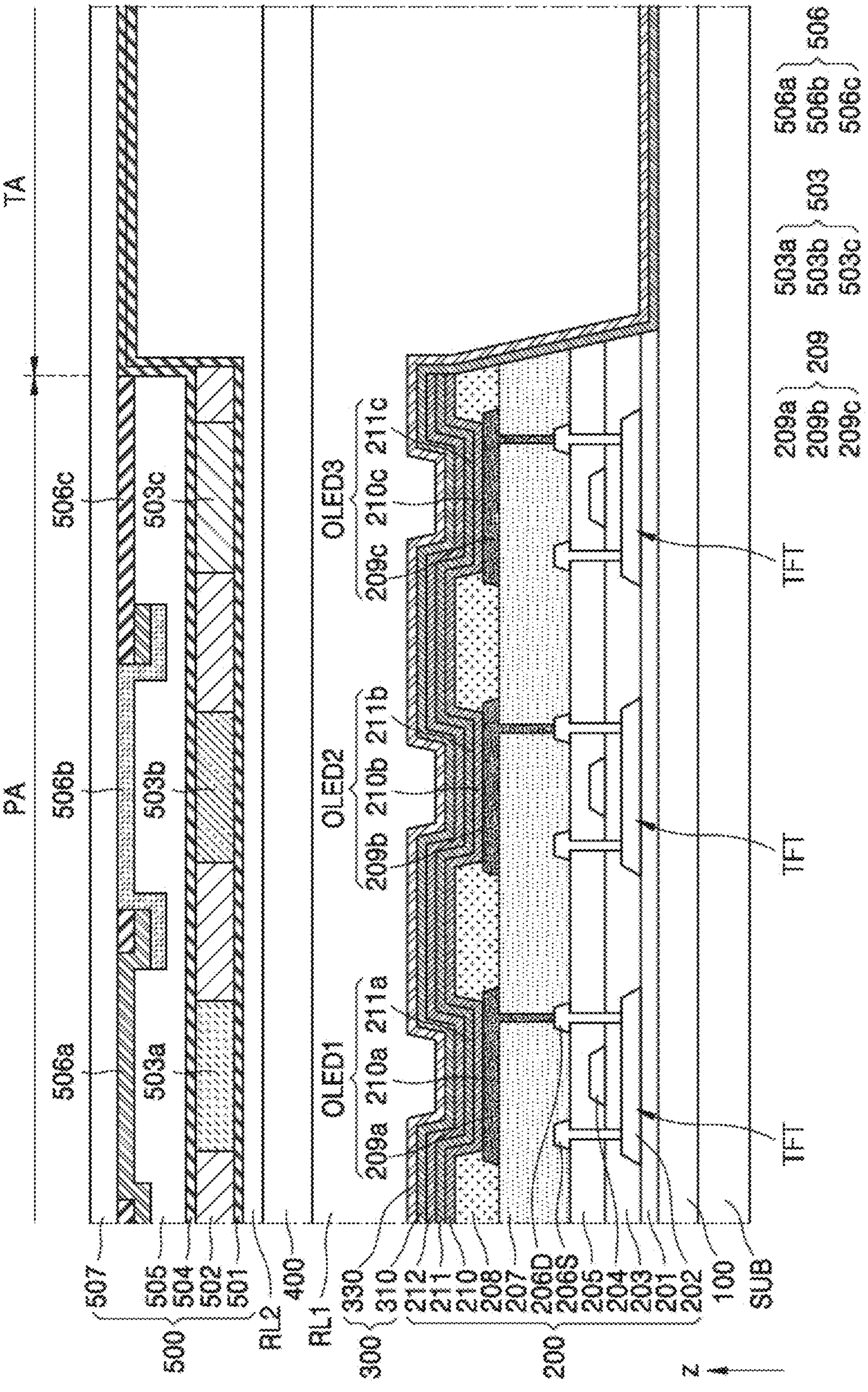
FIG. 22 is a cross-sectional view illustrating a display apparatus according to an embodiment.

FIG. 22 is a cross-sectional view illustrating a display apparatus according to an embodiment.

Referring to FIG. 22, in the transmissive area TA, the buffer layer 201, the gate insulating layer 203, the interlayer insulating layer 205, the organic insulating layer 207, the emission layer 210, the counter electrode 211, and the capping layer 212 may not be disposed. In other words, in the present embodiment, the buffer layer 201, the gate insulating layer 203, the interlayer insulating layer 205, the organic insulating layer 207, the emission layer 210, the counter electrode 211, and the capping layer 212 may not be disposed in the transmissive area TA.

The organic encapsulation layer 320 (see FIG. 20) may not be disposed over the pixel area PA and the transmissive area TA. Accordingly, the second inorganic encapsulation layer 330 may be disposed directly on the first inorganic encapsulation layer 310. A space between the second inorganic encapsulation layer 330 and the upper touch layer 400 may be filled with the first resin layer RL1. The second resin layer RL2 may be disposed between the upper touch layer 400 and the optical functional layer 500.

Because various layers are not disposed in the transmissive area TA in the embodiments described with reference to FIGS. 21 and 22, a light-transmitting property in the transmissive area TA may be improved. Also, layers not disposed in the transmissive area TA to improve a light-transmitting property in the transmissive area TA are not limited to those illustrated in FIGS. 21 and 22, and may be altered in various ways.

Figure 23:
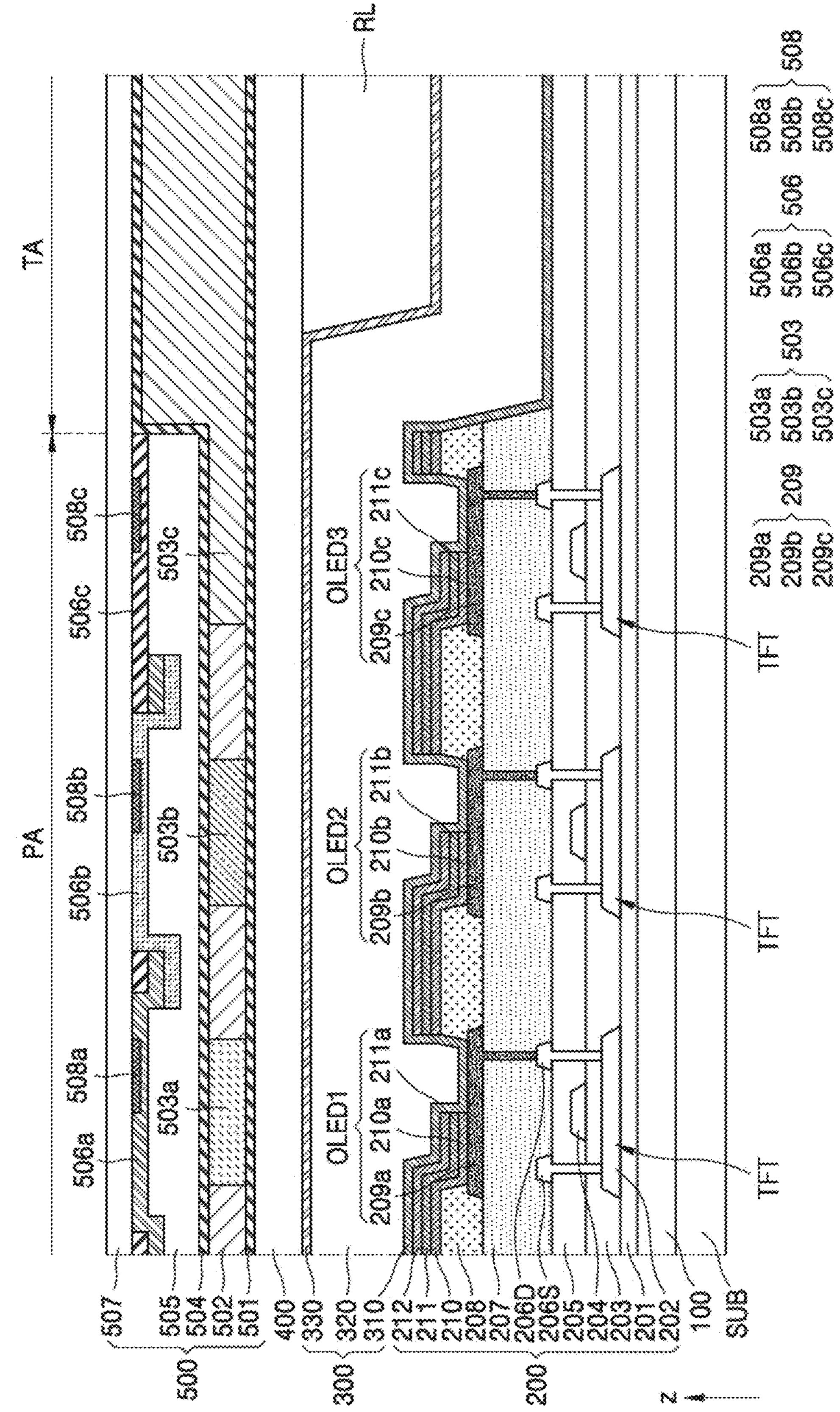
FIG. 23 is a cross-sectional view illustrating a display apparatus according to an embodiment.

FIG. 23 is a cross-sectional view illustrating a display apparatus according to an embodiment.

Referring to FIG. 23, parts of the emission layer 210, the counter electrode 211, and the capping layer 212 on each sub-pixel electrode 209 may not be disposed in some areas.

For example, parts of the first emission layer 210*a*, the first counter electrode 211*a*, and the capping layer 212 on the first sub-pixel electrode 209*a* may not be disposed in a first area. Accordingly, the first sub-pixel electrode 209*a* and the first inorganic encapsulation layer 310 may directly contact each other in the first area.

Likewise, in a second area, parts of the second emission layer 210*b*, the second counter electrode 211*b*, and the capping layer 212 on the second sub-pixel electrode 209*b* may not be disposed. Accordingly, the second sub-pixel electrode 209*b* and the first inorganic encapsulation layer 310 may directly contact each other in the second area.

Likewise, in a third area, parts of the third emission layer 210*c*, the third counter electrode 211*c*, and the capping layer 212 on the third sub-pixel electrode 209*c* may not be disposed. Accordingly, the third sub-pixel electrode 209*c* and the first inorganic encapsulation layer 310 may directly contact each other in the third area.

A reflective layer 508 may be disposed between the color filter layer 506 and the fourth insulating layer 507. In an embodiment, the reflective layer 508 may be disposed in the color filter layer 506. The reflective layer 508 may include a metal capable of reflecting light such as silver (A) or aluminum (Al).

The reflective layer 508 may include a first reflective layer 508*a*, a second reflective layer 508*b*, and a third reflective layer 508*c*. The first reflective layer 508*a* may overlap the first area. The second reflective layer 508*b* may overlap the second area. The third reflective layer 508*c* may overlap the third area.

In an embodiment, light emitted from the first emission layer 210*a* may generate light corresponding to the first color element 503*a*, and part of light emitted from the first color element 503*a* may pass through the first color filter 506*a* and may generally travel in the +z direction. Another part of the light emitted from the first color element 503*a* may be reflected by the first reflective layer 508*a* and may generally travel in the −z direction.

In an embodiment, light emitted from the second emission layer 210*b* may generate light corresponding to the second color element 503*b*, and part of light emitted from the second color element 503*b* may pass through the second color filter 506*b* and may generally travel in the +z direction. Another part of the light emitted from the second color element 503*b* may be reflected by the second reflective layer 508*b* and may generally travel in the −z direction.

In an embodiment, light emitted from the third emission layer 210*c* may pass through the third color element 503*c*. Part of light passing through the third color element 503*c* may pass through the third color filter 506*c* and may generally travel in the +z direction. Another part of the light passing through the third color element 503*c* may be reflected by the third reflective layer 508*c* and may generally travel in the −z direction.

Through the above structure, a display apparatus capable of displaying an image by emitting in both directions (e.g., the +z direction and the −z direction) may be implemented. In this case, the sub-pixel electrodes may be transparent electrodes or semitransparent electrodes. Also, in this case, structures of the upper touch layer 400 and the lower touch layer 100 for improving a transmittance in the pixel area PA may be applied in various ways.

In the present embodiment, the third color element 503*c* may extend to the transmissive area TA. Because the third color element 503*c* may include scattering particles, an image of an object located on the opposite side of a user in the transmissive area TA may be seen more clearly.

Although the resin layer RL is disposed only in the transmissive area TA in the present embodiment, the disclosure is not limited thereto. The resin layer RL may be freely disposed to planarize an arbitrary layer.

Figure 24:
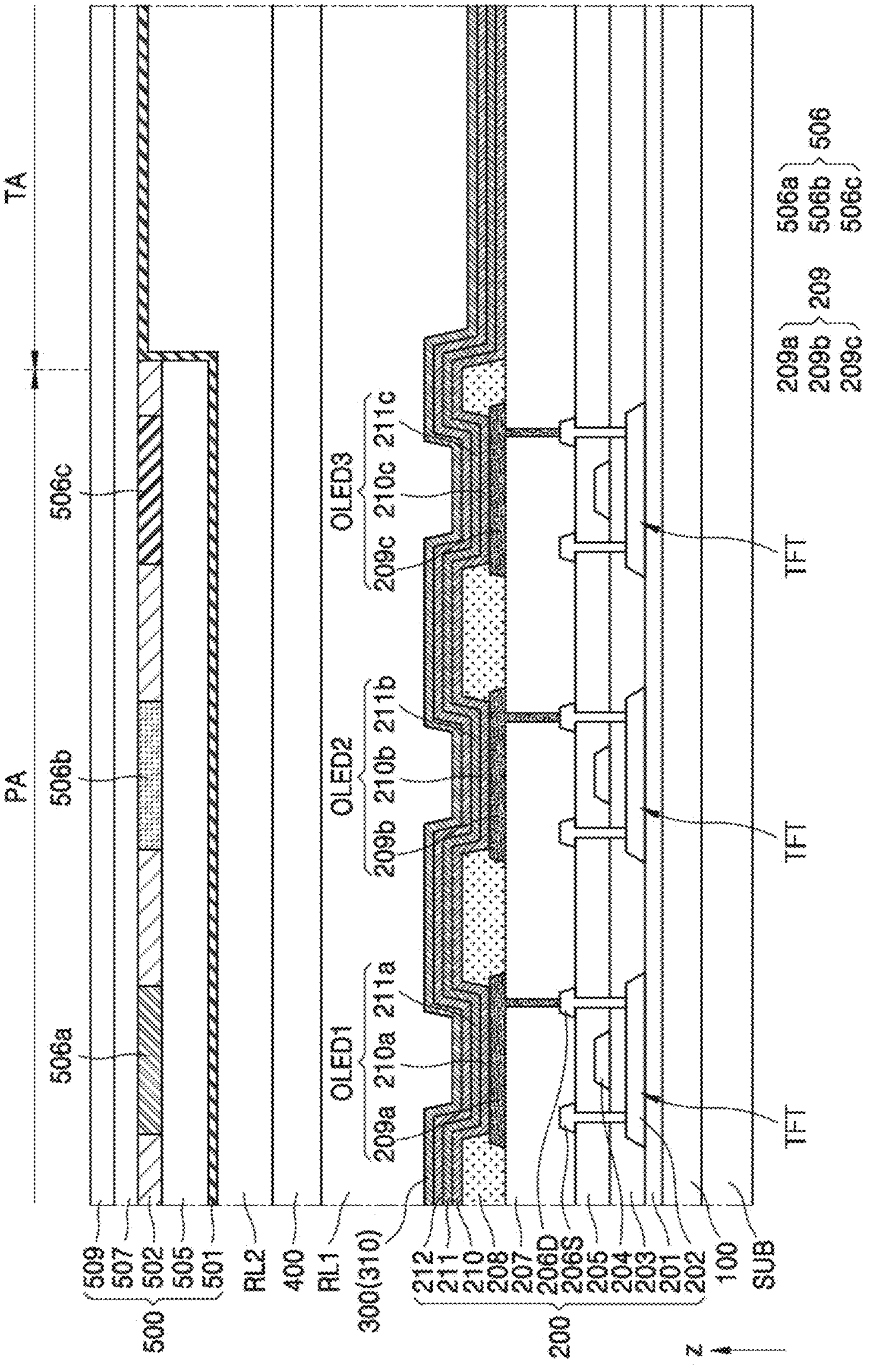
FIG. 24 is a cross-sectional view illustrating a display apparatus according to an embodiment.

FIG. 24 is a cross-sectional view illustrating a display apparatus according to an embodiment.

Referring to FIG. 24, compared to FIG. 20, the organic encapsulation layer 320, the second inorganic encapsulation layer 330, the color element layer 503, and the second insulating layer 504 may be omitted.

The first resin layer RL1 may be disposed on the first inorganic encapsulation layer 310 and may provide a flat top surface. The upper touch layer 400 may be disposed on the first resin layer RL1. The second resin layer RL2 may be disposed on the upper touch layer 400 and may provide a flat top surface. The first insulating layer 501 may be disposed on the second resin layer RL2, and the third insulating layer 505 may be disposed on the first insulating layer 501. The bank layer 502 and the color filter layer 506 may be disposed on the third insulating layer 505. Each opening of the bank layer 502 may be filled with the color filter layer 506. Because the bank layer 502 functions as a light-blocking layer, the first to third color filters 506*a*, 506*b*, and 506*c* may not overlap each other. The fourth insulating layer 507 may be disposed on the bank layer 502, the color filter layer 506, and the first insulating layer 501. The fifth insulating layer 509 formed of a glass material may be disposed on the fourth insulating layer 507. The fifth insulating layer 509 may be omitted according to embodiments.

The embodiments of the upper touch layer 400 described with reference to FIGS. 4 to 10, the embodiments of the lower touch layer 100 described with reference to FIGS. 11 to 19, and the embodiments of other layers described with reference to FIGS. 20 to 24 may be combined in various ways. It should be understood that various combinations of the embodiments and equivalents thereof also fall within the scope of the disclosure.

Figure 25:
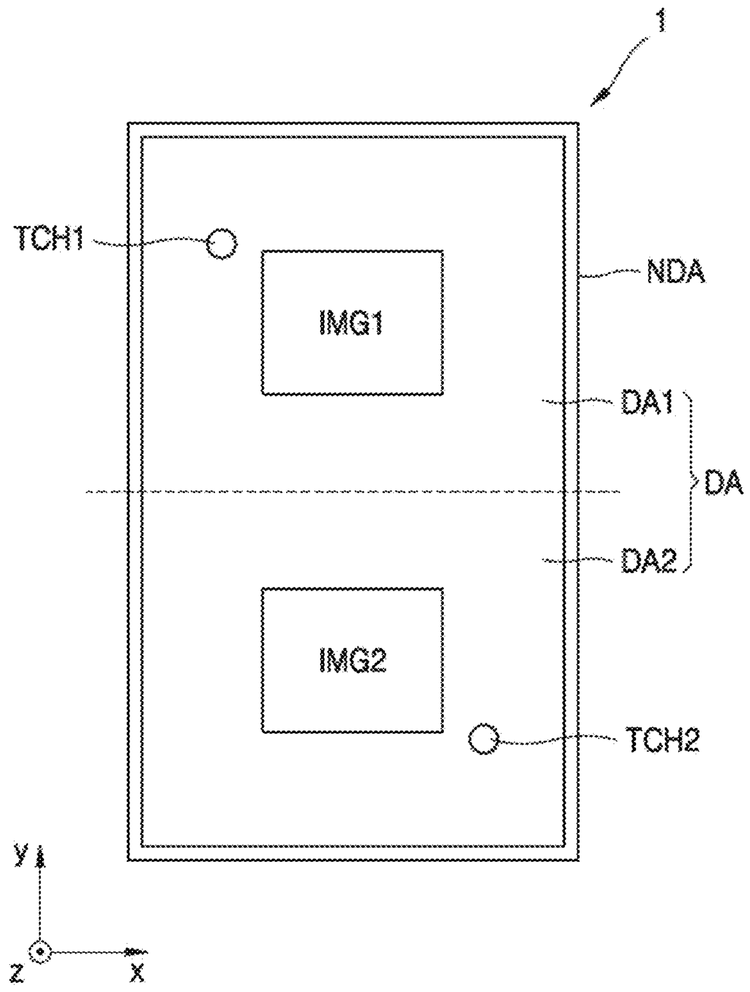
FIGS. 25 and 26 are schematic views illustrating a method of controlling a display apparatus according to an embodiment.
Figure 26:
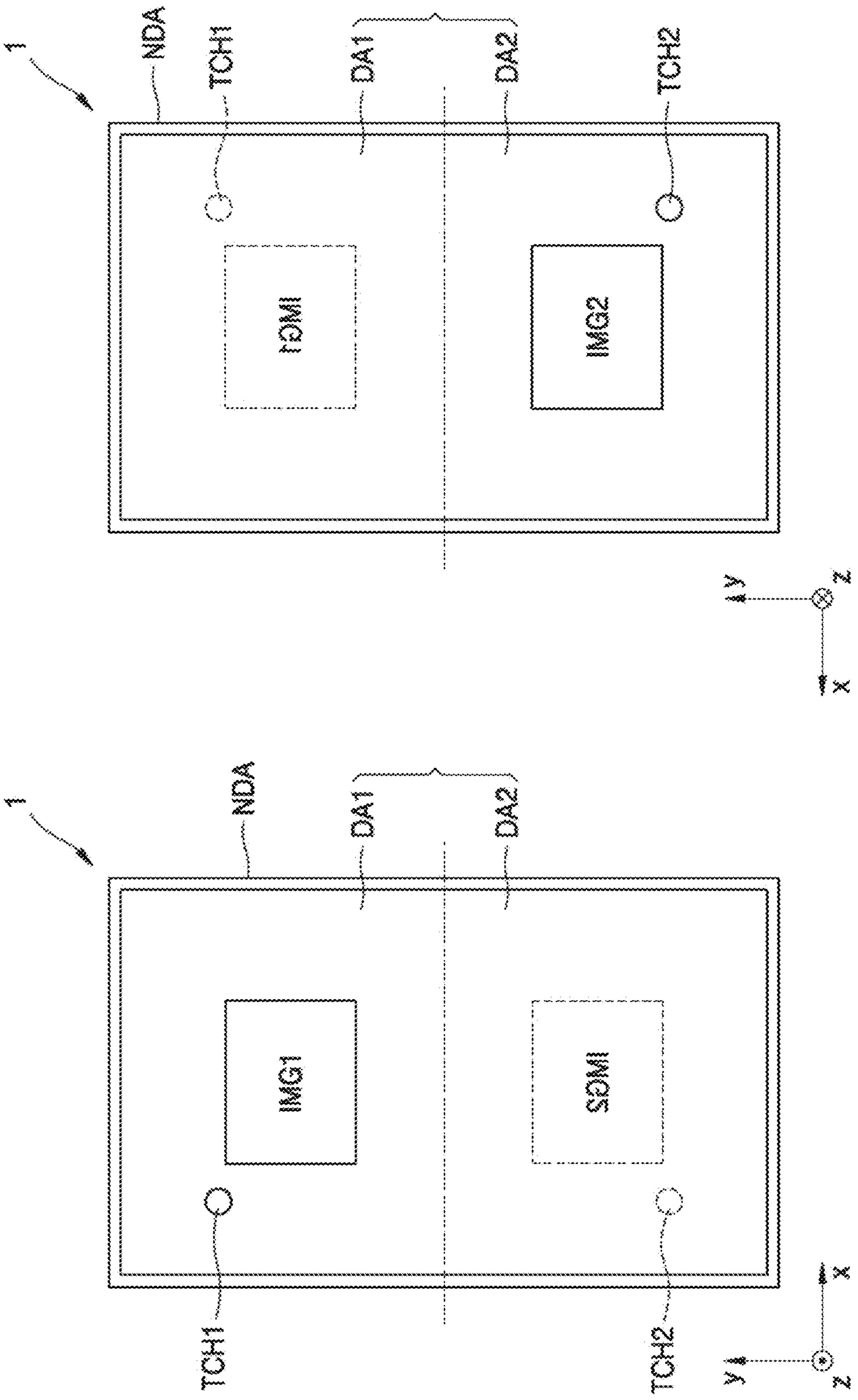

FIGS. 25 and 26 are schematic views illustrating a method of controlling a display apparatus according to an embodiment.

Referring to FIG. 25, touch signals may be simultaneously input to two points on a first surface, for example, a surface facing the +z direction, of the display apparatus 1. For example, a first touch signal TCH1 may be input to a first display area DA1 of the display area DA of the display apparatus 1 and a second touch signal TCH2 may be input to a second display area DA2. In this case, the display apparatus 1 may individually control and display images corresponding to respective touch signals by displaying a first image IMG1 corresponding to the first touch signal TCH1 on the first display area DA1 and displaying a second image IMG2 corresponding to a second touch signal TCH2 on the second display area DA2.

Referring to FIG. 26, the display apparatus 1 of the disclosure including the upper touch layer 400 and the lower touch layer 100 described with reference to FIGS. 1 to 24 may receive touch signals from both surfaces. For example, the display apparatus 1 may receive the first touch signal TCH1 from a first surface facing the +z direction and may receive the second touch signal TCH2 from a second surface facing the −z direction. In this case, the display apparatus 1 may display the first image IMG1 corresponding to the first touch signal TCH1 on the first surface in the first display area DA1. At the same time, the display apparatus 1 may display the second image IMG2 corresponding to the second touch signal TCH2 on the second surface in the second display area DA2. Accordingly, the display apparatus may receive touch signals from both surfaces and may display images corresponding to the both surfaces at the same time.

Figure 27:
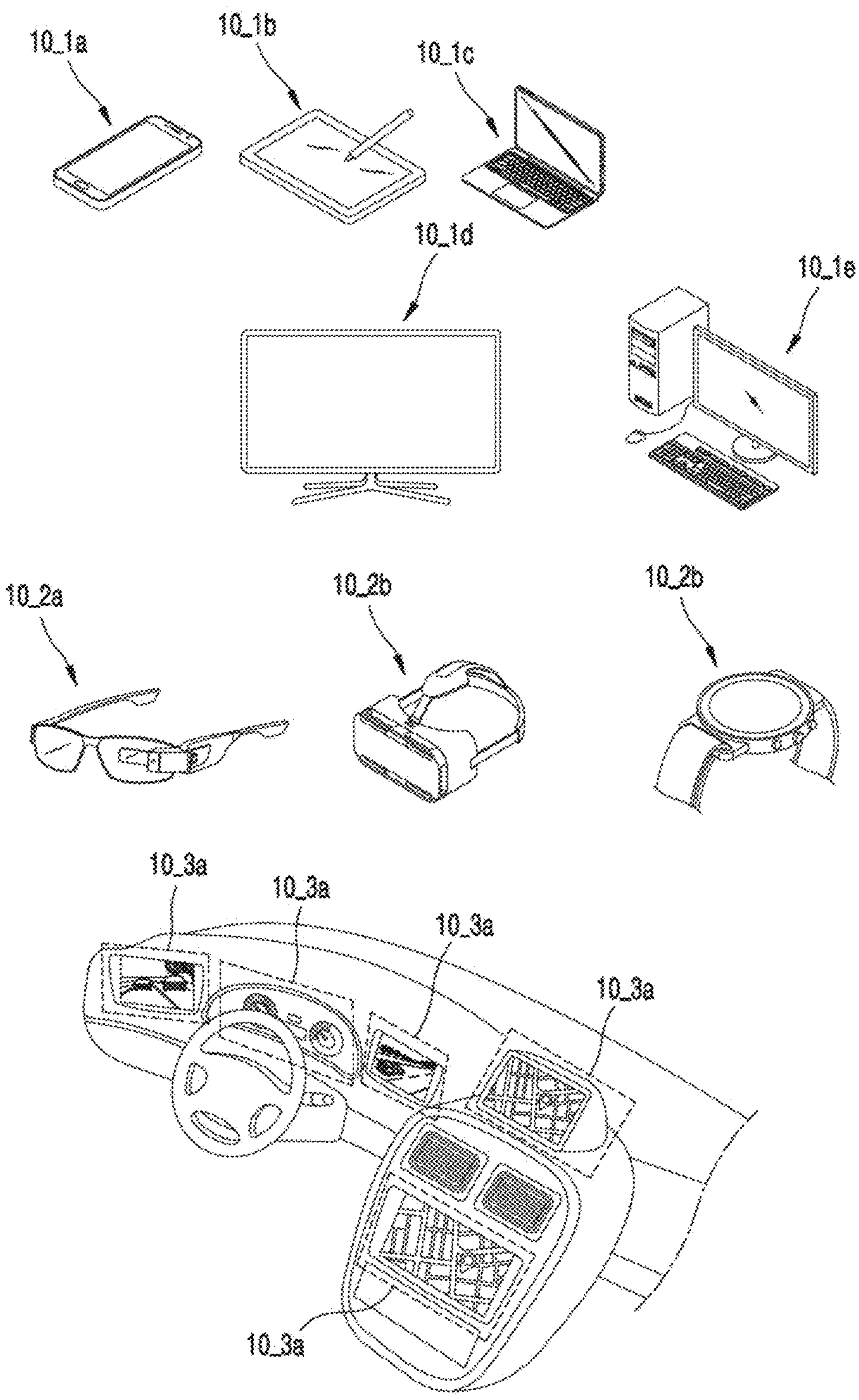
FIG. 27 is a schematic view illustrating electronic devices according to various embodiments.

Referring to FIG. 27, various electronic devices including display apparatuses according to one or more embodiments may be provided. The electronic devices may include electronic devices for displaying images, such as smartphones 10_1*a*, tablet PCs 10_1*b*, laptops 10_1*c*, televisions 10_1*d*, and desktop monitors 10_1*e*. The electronic devices may include wearable electronic devices such smart glasses 10_2*a*, head-mounted displays 10_2*b*, and smart watches 10_2*c*. The electronic devices may include automotive electronics 10_3, such as an instrument panel, a center fascia, center information displays (CIDs) disposed at a dashboard, and room mirror displays.

According to an embodiment, there is provided a transparent display apparatus allowing an object behind the display apparatus to be seen and capable of receiving touch input from both surfaces. According to another embodiment, there is provided a transparent display apparatus capable of displaying images on both surfaces and receiving touch input from both surfaces at the same time.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by one of ordinary skill in the art that various changes in form and details may be made therein without departing from the spirit and scope as defined by the following claims.

What is claimed is:

1. A display apparatus comprising:

a substrate comprising a pixel area and a transmissive area;

a display element layer disposed on the substrate and comprising a light-emitting element disposed in the pixel area;

an upper touch layer disposed on the display element layer and comprising upper touch electrodes at least partially surrounding the pixel area and the transmissive area, and a first conductive layer overlapping the transmissive area; and a lower touch layer disposed under the display element layer and comprising lower touch electrodes at least partially surrounding the pixel area and the transmissive area.

2. The display apparatus of claim 1, wherein the first conductive layer further overlaps a pixel area disposed adjacent to the transmissive area which is overlapped by the first conductive layer.

3. The display apparatus of claim 1, wherein the upper touch electrodes comprise a first upper touch electrode and a second upper touch electrode disposed on the first upper touch electrode, and the first conductive layer is disposed on the second upper touch electrode.

4. The display apparatus of claim 3, wherein the first conductive layer and the second upper touch electrode contact each other.

5. The display apparatus of claim 1, wherein the upper touch electrodes comprise:

a first upper touch electrode comprising a plurality of lines; and a second upper touch electrode disposed on the first upper touch electrode and comprising a plurality of lines, and wherein one of the plurality of lines of the second upper touch electrode overlaps two or more of the plurality of lines of the first upper touch electrode.

6. The display apparatus of claim 1, wherein the lower touch layer further comprises a second conductive layer disposed between the lower touch electrodes and the display element layer, and wherein the second conductive layer overlaps the pixel area.

7. The display apparatus of claim 6, wherein the second conductive layer overlaps the pixel area and the transmissive area.

8. The display apparatus of claim 1, wherein some of the lower touch electrodes overlap the light-emitting element and comprise an opening.

9. The display apparatus of claim 1, wherein at least some of the lower touch electrodes are integrally formed over the pixel area and transmissive area on the substrate.

10. The display apparatus of claim 1, wherein, when viewed in a thickness direction of the substrate, widths of at least some of the lower touch electrodes are greater than widths of at least some of the upper touch electrodes.

11. A display apparatus comprising:

a substrate comprising a pixel area and a transmissive area;

a display element layer disposed on the substrate and comprising a light-emitting element disposed in the pixel area;

an upper touch layer disposed on the display element layer and comprising upper touch electrodes at least partially surrounding the pixel area and the transmissive area; and a lower touch layer disposed under the display element layer and comprising lower touch electrodes at least partially surrounding the pixel area and the transmissive area, wherein widths of at least some of the lower touch electrodes are greater than widths of at least some of the upper touch electrodes.

12. The display apparatus of claim 11, wherein the upper touch electrodes comprise an upper opening disposed in an area corresponding to the light-emitting element, and the lower touch electrodes comprise a lower opening disposed in an area corresponding to the light-emitting element, and wherein a size of the upper opening is greater than a size of the lower opening.

13. The display apparatus of claim 12, wherein the display element layer comprises a plurality of light-emitting elements, and wherein the lower opening is disposed in an area corresponding to two or more of the light-emitting elements.

14. The display apparatus of claim 11, wherein a width of a portion of the lower touch electrodes extending in a first direction is different from a width of a portion of the lower touch electrodes extending in a second direction different from the first direction.

15. The display apparatus of claim 11, wherein some of the lower touch electrodes overlap the light-emitting element and comprise an opening.

16. The display apparatus of claim 11, wherein the upper touch layer further comprises a first conductive layer disposed on the upper touch electrodes, directly contacting at least some of the upper touch electrodes, and overlapping the transmissive area.

17. The display apparatus of claim 11, wherein the lower touch layer further comprises a second conductive layer disposed between the lower touch electrodes and the display element layer and overlapping the pixel area.

18. The display apparatus of claim 17, wherein the second conductive layer of the lower touch layer overlaps the pixel area and the transmissive area.

19. The display apparatus of claim 11, wherein the lower touch electrodes comprise a first lower touch electrode and a second lower touch electrode disposed on the first lower touch electrode, and wherein the first lower touch electrode is integrally formed over the pixel area and transmissive area on the substrate.

20. An electronic device comprising a display apparatus, wherein the display apparatus comprises:

a substrate comprising a pixel area and a transmissive area;

a display element layer disposed on the substrate and comprising a light-emitting element disposed in the pixel area;

an upper touch layer disposed on the display element layer and comprising upper touch electrodes at least partially surrounding the pixel area and the transmissive area, and a first conductive layer overlapping the transmissive area; and a lower touch layer disposed under the display element layer and comprising lower touch electrodes at least partially surrounding the pixel area and the transmissive area.

* * * * *